US011610905B2

(12) United States Patent
Inden

(10) Patent No.: US 11,610,905 B2
(45) Date of Patent: Mar. 21, 2023

(54) SEMICONDUCTOR MEMORY DEVICE

(71) Applicant: Kioxia Corporation, Tokyo (JP)

(72) Inventor: Tomoya Inden, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 323 days.

(21) Appl. No.: 16/793,865

(22) Filed: Feb. 18, 2020

(65) Prior Publication Data

US 2021/0066325 A1   Mar. 4, 2021

(30) Foreign Application Priority Data

Aug. 28, 2019   (JP) .............................. JP2019-155808

(51) Int. Cl.
*H01L 27/105*      (2006.01)
*H01L 27/11524*    (2017.01)
(Continued)

(52) U.S. Cl.
CPC .... *H01L 27/11524* (2013.01); *H01L 27/1025* (2013.01); *G11C 16/08* (2013.01); *H01L 27/11551* (2013.01)

(58) Field of Classification Search
CPC ........... H01L 27/11524; H01L 27/1025; H01L 27/11551; H01L 27/11526; H01L 27/11548; H01L 27/11556; H01L 27/11573; H01L 27/11575; H01L 27/11582; H01L 27/11529; H01L 27/1157; H01L 21/8229; H01L 21/8239; H01L 27/01; H01L 27/222; H01L 27/24; H01L 29/685; H01L 29/792; H01L 29/8615; H01L 45/04; H01L 2027/11838; H01L 2924/13089; H01L 2924/14; H01L 27/11568; H01L 21/76877; H01L 21/31116; H01L 21/31053; H01L 29/7889; H01L 29/7883; H01L 21/76816; H01L 29/66833; H01L 29/40117;
(Continued)

(56) References Cited

U.S. PATENT DOCUMENTS

2016/0329343 A1* 11/2016 Pachamuthu ....... H01L 27/1157
2017/0162592 A1*  6/2017 Nishikawa .......... H01L 23/5228
(Continued)

FOREIGN PATENT DOCUMENTS

JP        2011-138945 A      7/2011

*Primary Examiner* — Samuel Park
(74) *Attorney, Agent, or Firm* — Kim & Stewart LLP

(57) ABSTRACT

A semiconductor memory device includes a substrate, first conductor layers, second conductor layers, a third conductor layer, and an insulator layer. The substrate includes a first region, a second region, and a third region separating the first and second regions. The first conductor layers are above the first region. The second conductor layers are above an uppermost one of the first conductor layers. The third conductor layer is above the second region. The insulator layer is above the second and third regions. The insulator layer includes first and second portions. The first portion is above the third conductor layer at a height from the substrate greater than a height of the uppermost one of the first conductor layers and extends along a substrate surface direction. The second portion extends along a substrate thickness direction and contacts a surface of the substrate in the third region.

15 Claims, 33 Drawing Sheets

(51) Int. Cl.
    *H01L 27/102*       (2023.01)
    *H01L 27/11551*    (2017.01)
    *G11C 16/08*        (2006.01)

(58) Field of Classification Search
    CPC ............ H01L 27/11578; H01L 23/528; H01L 23/5226; H01L 29/7926; H01L 27/11519; H01L 27/11565; G11C 16/08; G11C 16/0483
    See application file for complete search history.

(56)             References Cited

U.S. PATENT DOCUMENTS

2019/0006384 A1*   1/2019   Iwasaki ............. H01L 27/11575
2019/0189632 A1*   6/2019   Lee .................... H01L 27/1157

\* cited by examiner

SEMICONDUCTOR MEMORY DEVICE

CROSS-REFERENCE TO RELATED APPLICATION(S)

This application is based upon and claims the benefit of priority from Japanese Patent Application No. 2019-155808, filed Aug. 28, 2019, the entire contents of which are incorporated herein by reference.

FIELD

Embodiments described herein relate generally to a semiconductor memory device.

BACKGROUND

A NAND flash memory capable of storing data in a nonvolatile manner is known.

DETAILED DESCRIPTION

Figure 1:
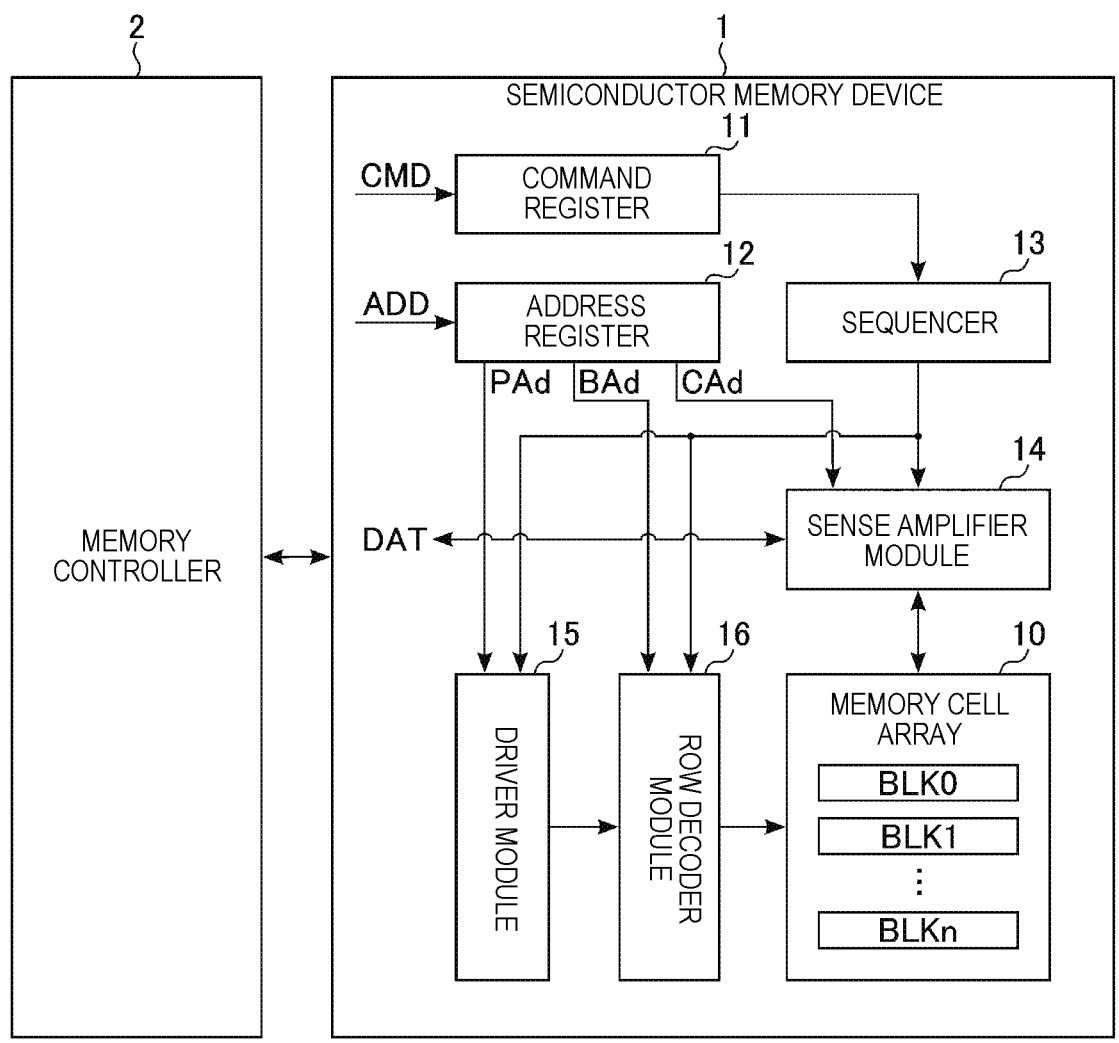
FIG. 1 is a block diagram of a semiconductor memory device according to an embodiment.

Embodiments are directed to achieving an improved yield of semiconductor memory devices.

In general, according to an embodiment, a semiconductor memory device includes a substrate, a stack of first conductor layers, a stack of second conductor layers, a semiconductor pillar, a third conductor layer, and a first insulator layer. The substrate includes a first region on which memory cells are provided, a second region on which a control circuit of the memory cells is provided, and a third region separating the first region and the second region. The stack of first conductor layers is spaced from each other above the first region of the substrate. The stack of second conductor layers is spaced from each other above an uppermost one of the first conductor layers. The semiconductor pillar extends through the stack of first conductor layers and the stack of the second conductor layers. The third conductor layer is above the second region of the substrate. The first insulator layer is above the second and third regions of the substrate. The first insulator layer includes a first portion and a second portion. The first portion is above the third conductor layer at a height from the substrate higher greater than a height of the uppermost one of the first conductor layers and extends along a surface direction of the substrate. The second portion is continuous with the first portion, extends along a thickness direction of the substrate, and is in contact with a surface of the substrate in the third region.

Hereinafter, embodiments will be described with reference to the drawings. The embodiments exemplify apparatuses and methods for embodying the technical idea of the disclosure. The drawings are schematic or conceptual, and the dimensions and ratios of the drawings are not necessarily the same as actual ones. The technical idea of the present disclosure is not specified by the shape, structure, arrangement, and the like of the components.

In the following description, components having substantially the same functions and configurations are denoted by the same reference numerals. The numbers after the characters that constitute the reference signs are referenced by reference signs that include the same characters, and are used to distinguish between elements that have a similar configuration. If it is not necessary to distinguish between elements indicated by reference signs containing the same characters, each of the elements is referenced by a reference sign containing only the characters.

[1] Embodiment

Hereinafter, a semiconductor memory device 1 according to an embodiment will be described.

[1-1] Configuration of Semiconductor Memory Device 1

[1-1-1] Overall Configuration of Semiconductor Memory Device 1

FIG. 1 shows a configuration example of the semiconductor memory device 1 according to the embodiment. The semiconductor memory device 1 is a NAND flash memory capable of storing data in a nonvolatile manner, and may be controlled by an external memory controller 2.

As shown in FIG. 1, the semiconductor memory device 1 includes, for example, a memory cell array 10, a command register 11, an address register 12, a sequencer 13, a sense amplifier module 14, a driver module 15, and a row decoder module 16.

The memory cell array 10 includes a plurality of blocks BLK0 to BLKn (n is an integer of more than or equal to 1). The block BLK is a set of a plurality of memory cells capable of storing data in a nonvolatile manner, and is used as a data erasing unit, for example. Further, the memory cell array 10 is provided with a plurality of bit lines and a plurality of word lines. Each memory cell is associated with, for example, one bit line and one word line. A detailed configuration of the memory cell array 10 will be described below.

The command register 11 stores a command CMD received from the memory controller 2 by the semiconductor memory device 1. The command CMD includes instructions for causing the sequencer 13 to execute a read operation, a write operation, an erase operation, and the like, for example.

The address register 12 stores address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls the operation of the entire semiconductor memory device 1. For example, the sequencer 13 controls the sense amplifier module 14, the driver module 15, the row decoder module 16, and the like based on the command CMD stored in the command register 11 and executes a read operation, a write operation, an erase operation, and the like.

In the write operation, the sense amplifier module 14 applies a desired voltage to each bit line according to the write data DAT received from the memory controller 2. Further, in the read operation, the sense amplifier module 14 determines data stored in the memory cell based on the voltage of the bit line, and transfers the determination result to the memory controller 2 as read data DAT.

The driver module 15 generates a voltage to be used in a read operation, a write operation, an erase operation, and the like. Then, the driver module 15 applies the generated voltage to the signal line corresponding to the selected word line based on, for example, the page address PAd stored in the address register 12.

The row decoder module 16 selects one block BLK in the corresponding memory cell array 10 based on the block address BAd stored in the address register 12. Then, the row decoder module 16 transfers, for example, a voltage applied to the signal line corresponding to the selected word line, to the selected word line in the selected block BLK.

The semiconductor memory device 1 and the memory controller 2 described above may constitute one semiconductor device in a combination thereof. Examples of such a semiconductor device include, for example, a memory card such as SD™ card, a solid state drive (SSD), and the like.

[1-1-2] Circuit Configuration of Memory Cell Array 10

Figure 2:
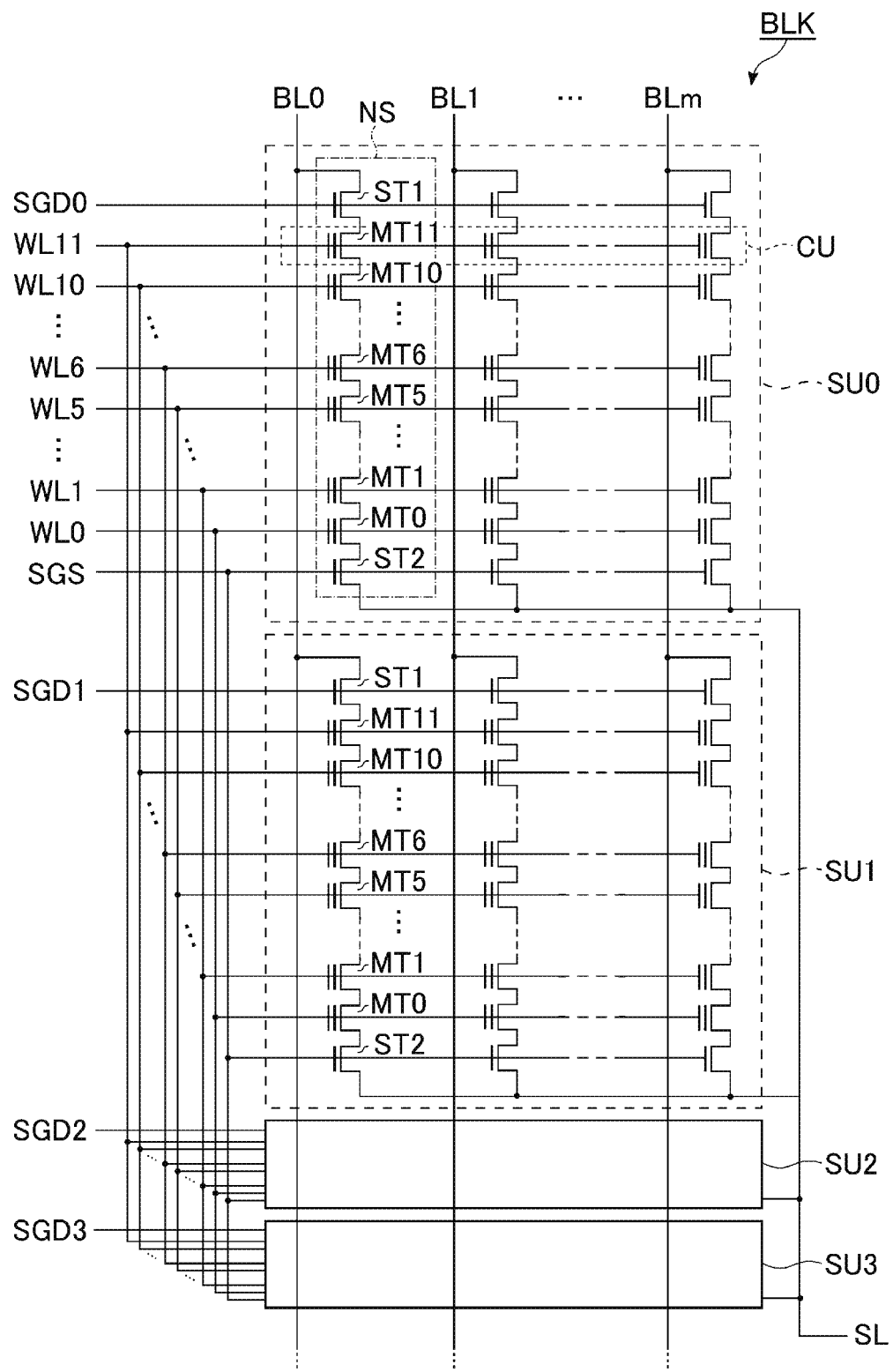
FIG. 2 is a circuit diagram of a memory cell array in the semiconductor memory device according to the embodiment.

FIG. 2 shows an example of a circuit configuration of the memory cell array 10 in the semiconductor memory device 1 according to the embodiment, in which one block BLK is extracted from the plurality of blocks BLK in the memory cell array 10. As shown in FIG. 2, the block BLK includes, for example, four string units SU0 to SU3.

Each string unit SU includes a plurality of NAND strings NS respectively associated with the bit lines BL0 to BLm (m is an integer of more than or equal to 1). Each NAND string NS includes, for example, memory cell transistors MT0 to MT11 and select transistors ST1 and ST2. The memory cell transistor MT includes a control gate and a charge storage layer, and stores data in a nonvolatile manner. Each of the select transistors ST1 and ST2 is used to select the string unit SU during various operations.

In each NAND string NS, the memory cell transistors MT0 to MT11 are connected in series. The drain of the select transistor ST1 is connected to the associated bit line BL, and the source of the select transistor ST1 is connected to one end of the memory cell transistors MT0 to MT11 connected in series. The drain of the select transistor ST2 is connected to the other end of the memory cell transistors MT0 to MT11 connected in series. The source of the select transistor ST2 is connected to a source line SL.

In the same block BLK, the control gates of the memory cell transistors MT0 to MT11 are commonly connected to the word lines WL0 to WL11, respectively. The gates of the select transistors ST1 in the string units SU0 to SU3 are commonly connected to select gate lines SGD0 to SGD3, respectively. The gates of the select transistors ST2 are commonly connected to the select gate line SGS.

In the circuit configuration of the memory cell array 10 described above, the word lines WL0 to WL5 correspond to a hole LMH described below, and the word lines WL6 to WL11 correspond to a hole UMH described below. The bit line BL is shared by the NAND strings NS to which the same column address is assigned in each string unit SU. For example, the source line SL is shared among a plurality of blocks BLK.

A set of a plurality of memory cell transistors MT connected to a common word line WL in one string unit SU is referred to as a cell unit CU, for example. For example, the storage capacity of the cell unit CU including the memory cell transistors MT each storing 1-bit data is defined as "one page data". The cell unit CU may have a storage capacity of two or more page data depending on the number of bits of data stored in the memory cell transistors MT.

The circuit configuration of the memory cell array 10 in the semiconductor memory device 1 according to the embodiment is not limited to the configuration described above. For example, the number of memory cell transistors MT and select transistors ST1 and ST2 in each NAND string NS may be designed to any number. The number of string units SU in each block BLK may be designed to any number.

Further, one or more dummy word lines may be provided between the word lines WL5 and WL6. When dummy word lines are provided, dummy transistors are provided between the memory cell transistors MT5 and MT6 of each NAND string NS in the number corresponding to the number of dummy word lines. The dummy transistor has a structure similar to that of the memory cell transistor MT and is a transistor that is not used for storing data.

[1-1-3] Structure of Memory Cell Array 10

An example of the structure of the semiconductor memory device 1 according to the embodiment will be described below. In the drawings referred to below, the X-direction corresponds to the extending direction of the word line WL, the Y-direction corresponds to the extending direction of the bit line BL, and the Z-direction corresponds to the vertical direction with respect to the surface of a semiconductor substrate SUB used for forming the semiconductor memory device 1. In the plan view, hatching is appropriately added in order to make the drawing easy to see. The hatching added to the plan view is not necessarily related to the material and characteristics of the component to which the hatching is added. In the cross-sectional view, the illustration of an interlayer insulating film or the like is appropriately omitted in order to make the drawing easy to see.

(Regarding the Planar Layout of the Semiconductor Memory Device 1)

Figure 3:
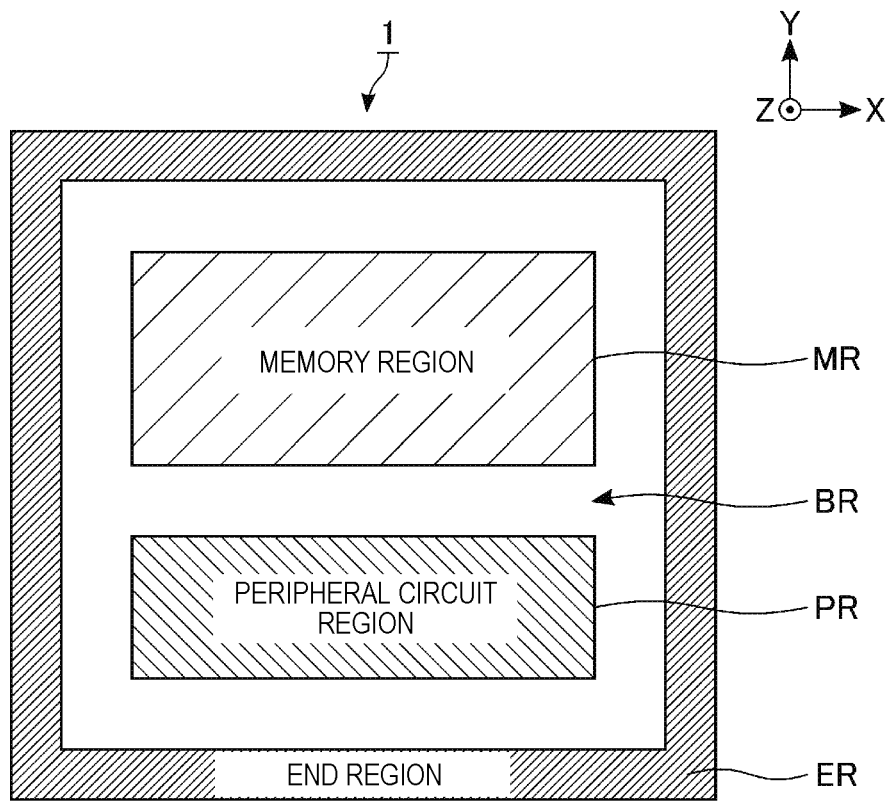
FIG. 3 illustrates a plan view of an example of a planar layout of the semiconductor memory device according to the embodiment.

FIG. 3 shows an example of a planar layout of the semiconductor memory device 1 according to the embodiment. As shown in FIG. 3, the planar layout of the semiconductor memory device 1 is divided into, for example, a memory region MR, a peripheral circuit region PR, an end region ER, and a boundary region BR.

The memory region MR is, for example, a rectangular region provided in an inner region on the semiconductor substrate SUB, and includes the memory cell array 10. The memory region MR may be arranged in any shape and any region. When the semiconductor memory device 1 includes a plurality of memory cell arrays 10, a plurality of memory regions MR may be provided on the semiconductor substrate SUB.

The peripheral circuit region PR is, for example, a rectangular region provided in an inner region on the semiconductor substrate SUB, and includes the sequencer 13 and the like. The peripheral circuit region PR may be arranged in any shape and any region, for example, adjacent to the memory region MR in the Y-direction. A plurality of peripheral circuit regions PR may be provided on the semiconductor substrate SUB.

The end region ER is a square annular region provided to surround the outer periphery of the memory region MR and the peripheral circuit region PR. The end region ER includes, for example, a structure similar to a stacked structure of the memory cell array 10 described below, and may include an alignment mark or the like. The structure in the end region ER may be removed by a dicing process at the time of manufacturing the semiconductor memory device 1.

The boundary region BR is a region that is surrounded by the end region ER and does not overlap with the memory region MR and the peripheral circuit region PR. In other words, the boundary region BR includes a portion surrounding the periphery of the memory region MR and a portion surrounding the periphery of the peripheral circuit region PR. The boundary region BR includes a structure that is directed to preventing adverse effects that may occur to the elements in the peripheral circuit region PR from the memory region MR and the end region ER during the manufacturing process of the semiconductor memory device 1.

(Regarding the Structure of the Semiconductor Memory Device 1 in the Memory Region MR)

Figure 4:
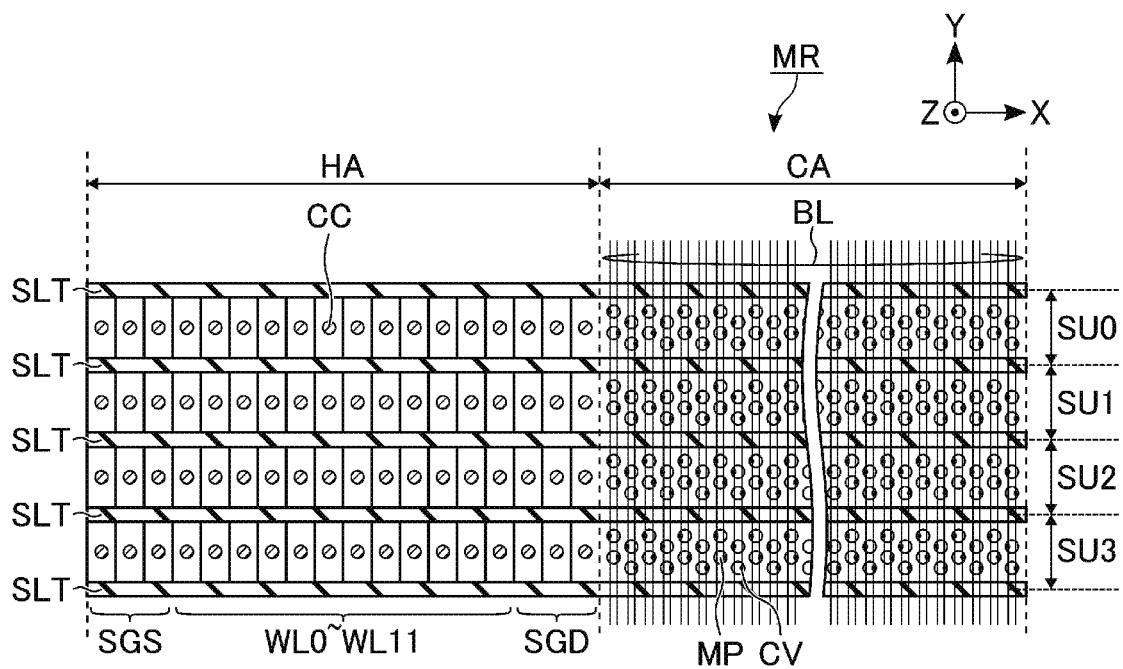
FIG. 4 illustrates a plan view of an example of a planar layout in a memory region of the semiconductor memory device according to the embodiment.

FIG. 4 is an example of a planar layout in the memory region MR of the semiconductor memory device 1 according to the embodiment, and shows an extracted region corresponding to one block BLK (that is, string units SU0 to SU3). As shown in FIG. 4, the memory region MR includes, for example, a cell area CA and a drawing area HA. In the memory region MR, the semiconductor memory device 1 includes a plurality of slits SLT, a plurality of memory pillars MP, and a plurality of contacts CV and CC.

The cell area CA and the drawing area HA are provided to extend in the Y-direction, and are arranged in the X-direction. The cell area CA occupies most of the memory region MR. The drawing area HA is provided at one end portion in the X-direction, for example. In the drawing area HA, each of the select gate line SGS, the word lines WL0 to WL11, and the select gate line SGD includes a portion (terrace portion) that does not overlap with the upper wiring layer (conductor layer). The shape of the portion that does not overlap with the upper wiring layer is similar to a step, a terrace, a rimstone, or the like. Specifically, a respective step is provided between the select gate line SGS and the word line WL0, between the word line WL0 and the word line WL1, between the word line WL10 and the word line WL11, and between the word line WL11 and the select gate line SGD. The drawing area HA may be provided at both end portions in the X-direction, respectively.

Each of the plurality of slits SLT is provided extending along the X-direction, and crosses the cell area CA and the drawing area HA in the X-direction. Further, the plurality of slits SLT are arranged in the Y-direction. The slit SLT is provided in the same wiring layer and divides the adjacent conductor layers through the slit SLT. Specifically, the slit SLT divides a plurality of wiring layers respectively corresponding to the word lines WL0 to WL11 and the select gate lines SGD and SGS.

Each memory pillar MP functions as one NAND string NS, for example. For example, the plurality of memory pillars MP are arranged in a staggered pattern of four rows in the cell area CA and in an area between two adjacent slits SLT. However, the number and arrangement of the memory pillars MP between two adjacent slits SLT are not limited thereto, and may be changed as appropriate.

Each of the plurality of bit lines BL extends at least partially in the Y-direction, and is arranged in the X-direction. Each bit line BL is arranged to overlap with at least one memory pillar MP for each string unit SU. In this example, two bit lines BL are arranged to overlap with each memory pillar MP. A contact CV is provided between one bit line BL among the plurality of bit lines BL overlapping the memory pillar MP, and the memory pillar MP. Each memory pillar MP is electrically connected to the corresponding bit line BL via the contact CV.

Each contact CC is used for connection between the word lines WL0 to WL11 and the select gate lines SGS and SGD, and the row decoder module 16. In the illustrated region, one contact CC is arranged on each terrace portion of the word lines WL0 to WL11 and the select gate lines SGS and SGD in the drawing area HA.

In the planar layout of the memory cell array 10 in the embodiment described above, each of the regions partitioned by the slits SLT corresponds to one string unit SU. That is, in this example, the string units SU0 to SU3, each extending in the X-direction, are arranged in the Y-direction. Thus, in the memory region MR and the drawing areas HA1 and HA2, for example, the layout shown in FIG. 4 is repeatedly arranged in the Y-direction.

In the example shown in FIG. 4, string units SU corresponding to the same block BLK are partitioned by slits SLT. In this case, the word lines WL and the select gate lines SGS corresponding to the same block BLK and provided in the same wiring layer are electrically connected through different wiring layers. Without being limited thereto, the slit SLT sandwiched between the slits SLT corresponding to the boundary of the block BLK only needs to divide at least the first select gate line SGD. In this case, the word lines WL provided in the same wiring layer in the same block BLK are continuously provided and electrically connected in the drawing areas HA1 and HA2.

Figure 5:
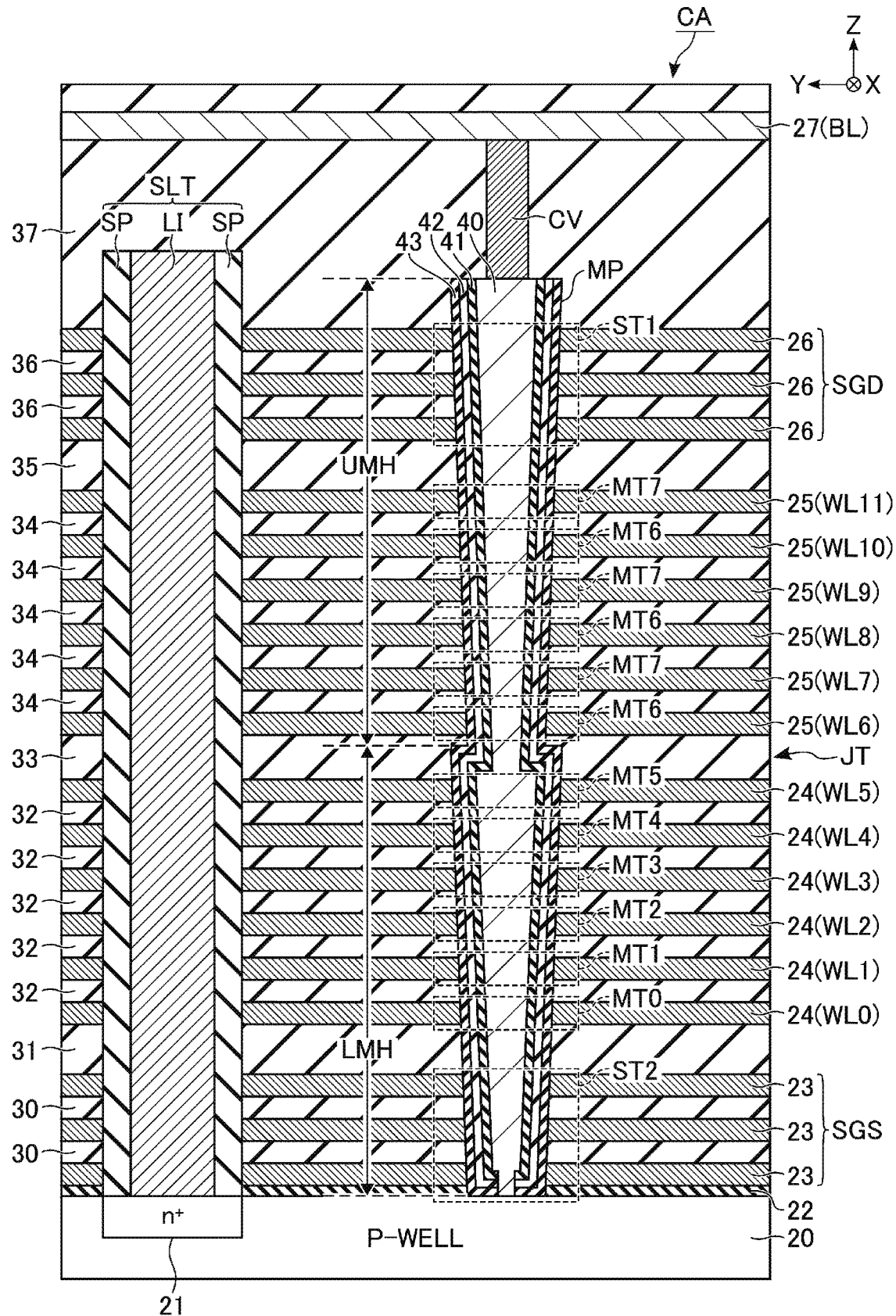
FIG. 5 illustrates a cross-sectional view of an example of a cross-sectional structure in a cell area in a memory region of the semiconductor memory device according to the embodiment.

FIG. 5 is an example of a cross-sectional structure in the cell area CA in the memory region MR of the semiconductor memory device 1 according to the embodiment, and shows a cross section along the Y-direction including the memory pillar MP shown in FIG. 4. As shown in FIG. 5, in the cell area CA, the semiconductor memory device 1 includes a P-type well region 20, an insulator layer 22, and conductor layers 23 to 27.

The P-type well region 20 is provided in the vicinity of the surface of the semiconductor substrate SUB, and includes an N-type semiconductor region 21. The N-type semiconductor region 21 is an N-type impurity diffusion region provided in the vicinity of the surface of the P-type well region 20. For example, phosphorus is doped in the N-type semiconductor region 21.

An insulator layer 22 is provided on the P-type well region 20. On the insulator layer 22, the conductor layers 23 and the insulator layers 30 are alternately stacked. The conductor layer 23 is formed, for example, in a plate shape spreading along the XY plane. The plurality of stacked conductor layers 23 are used as the select gate lines SGS. The conductor layer 23 contains, for example, tungsten.

An insulator layer 31 is provided on the uppermost conductor layer 23. On the insulator layer 31, conductor layers 24 and insulator layers 32 are alternately stacked. The conductor layer 24 is formed, for example, in a plate shape spreading along the XY plane. The plurality of stacked conductor layers 24 are used as word lines WL0 to WL5 in order from the P-type well region 20 side. The conductor layer 24 contains, for example, tungsten.

An insulator layer 33 is provided on the uppermost conductor layer 24. On the insulator layer 33, conductor layers 25 and insulator layers 34 are alternately stacked. The conductor layer 25 is formed, for example, in a plate shape spreading along the XY plane. The plurality of stacked conductor layers 25 are used as word lines WL6 to WL11 in order from the P-type well region 20 side. The conductor layer 25 contains, for example, tungsten.

An insulator layer 35 is provided on the uppermost conductor layer 25. On the insulator layer 35, conductor layers 26 and insulator layers 36 are alternately stacked. The conductor layer 26 is formed, for example, in a plate shape spreading along the XY plane. The plurality of stacked conductor layers 26 are used as the select gate lines SGD. The conductor layer 26 contains, for example, tungsten.

An insulator layer 37 is provided on the uppermost conductor layer 26. A conductor layer 27 is provided on the insulator layer 37. The conductor layer 27 is formed, for example, in a line shape extending in the Y-direction, and is used as the bit line BL. That is, in the region not shown, the plurality of conductor layers 27 are arranged along the X-direction. The conductor layer 27 contains, for example, copper.

The thickness of the insulator layer 33 is thicker than the thickness of each of the insulator layers 32 and 34. In other words, the distance between the uppermost conductor layer 24 and the lowermost conductor layer 25 is larger than the distance between adjacent conductor layers 24 and the distance between adjacent conductor layers 25.

The memory pillar MP is provided extending along the Z-direction and penetrates the conductor layers 23 to 26. Further, each of the memory pillars MP includes a first portion formed in the lower layer hole LMH and a second portion formed in the upper layer hole UMH.

Specifically, the first portion corresponding to the hole LMH penetrates the conductor layers 23 and 24, and the bottom thereof is in contact with the P-type well region 20. The second portion corresponding to the hole UMH is provided above the first portion corresponding to the hole LMH and penetrates the conductor layers 25 and 26. A layer including a boundary portion between the first portion and the second portion of the memory pillar MP, that is, a wiring layer provided with the insulator layer 33 is also referred to as a junction layer JT. The memory pillar MP may have a structure in which the outer diameter is increased in the junction layer JT.

Each of the memory pillars MP includes, for example, a semiconductor layer 40, a tunnel insulating film 41, an insulating film 42, and a block insulating film 43. Each of the semiconductor layer 40, the tunnel insulating film 41, the insulating film 42, and the block insulating film 43 is provided unbroken (that is, as continuous films) between the first portion and the second portion of the memory pillar MP.

Specifically, the semiconductor layer 40 is provided extending along the Z-direction. For example, the upper end of the semiconductor layer 40 is located upper than the uppermost conductor layer 26, and the lower end of the semiconductor layer 40 is in contact with the P-type well region 20. The tunnel insulating film 41 covers the side surface of the semiconductor layer 40. The insulating film 42 covers the side surface of the tunnel insulating film 41. The block insulating film 43 covers the side surface of the insulating film 42.

In the structure of the memory pillar MP described above, a portion where the memory pillar MP and the conductor layer 23 intersect each other functions as the select transistor ST2. Each of a portion where the memory pillar MP and the conductor layer 24 intersect each other and a portion where the memory pillar MP and the conductor layer 25 intersect each other functions as the memory cell transistor MT. A portion where the memory pillar MP and the conductor layer 26 intersect each other functions as the select transistor ST1. That is, the semiconductor layer 40 functions as a channel for each of the memory cell transistors MT0 to MT11 and the select transistors ST1 and ST2. The insulating film 42 functions as a charge storage layer of the memory cell transistor MT.

A columnar contact CV is provided on the semiconductor layer 40 in the memory pillar MP. One conductor layer 27, that is, one bit line BL is in contact with the upper surface of the contact CV. As described above, one contact CV is connected to one conductor layer 27 (one bit line BL) in each of the spaces partitioned by the slits SLT.

The slit SLT is formed in a plate shape at least partially spreading along the XZ plane, and divides the insulator layer 22, the conductor layers 23 to 26, and the insulator layers 30 to 36. The upper end of the slit SLT is included in a layer between the uppermost conductor layer 26 and the conductor layer 27. The lower end of the slit SLT is in contact with the N-type semiconductor region 21 in the P-type well region 20. Further, the slit SLT includes, for example, a contact LI and a spacer SP.

The contact LI is formed in a plate shape at least partially spreading along the XZ plane. The bottom of the contact LI is electrically connected to the N-type semiconductor region 21. The contact LI is used as the source line SL. The contact LI may be a semiconductor or a metal. The spacer SP covers the side surface of the contact LI. The contact LI is separated from each of the conductor layers 23 to 26 and the insulator layers 30 to 36 by the spacer SP. That is, the contact LI and the plurality of wiring layers adjacent to the slit SLT are insulated by the spacer SP. As the spacer SP, an insulator such as silicon oxide ($SiO_2$) or silicon nitride (SiN) is used.

Figure 6:
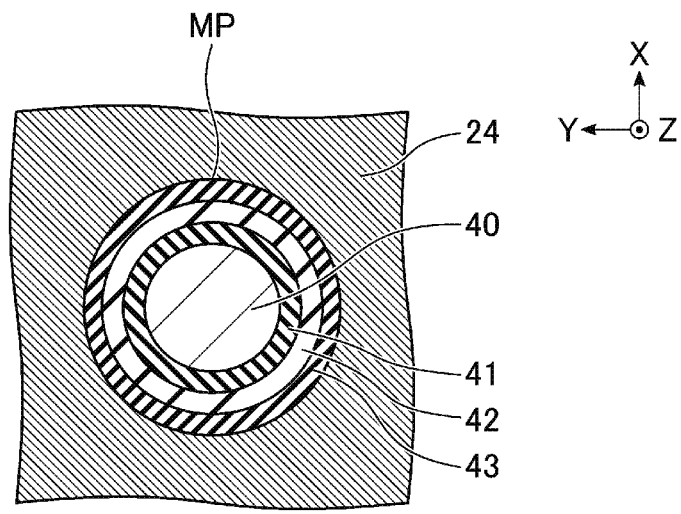
FIG. 6 illustrates a cross-sectional view of an example of a cross-sectional structure of a memory pillar in the semiconductor memory device according to the embodiment.

FIG. 6 shows an example of a cross-sectional structure of the memory pillar MP in the semiconductor memory device 1 according to the embodiment. More specifically, FIG. 6 shows a cross-sectional structure of the memory pillar MP in a layer parallel to the surface of the semiconductor substrate SUB and including the conductor layer 24.

As shown in FIG. 6, in the layer including the conductor layer 24, the semiconductor layer 40 is provided, for example, in the center of the memory pillar MP. The tunnel insulating film 41 surrounds the periphery of the semiconductor layer 40. The insulating film 42 surrounds the periphery of the tunnel insulating film 41. The block insulating film 43 surrounds the periphery of the insulating film 42. The conductor layer 24 surrounds the periphery of the block insulating film 43. Each of the tunnel insulating film 41 and the block insulating film 43 contains, for example, silicon oxide ($SiO_2$). The insulating film 42 contains, for example, silicon nitride (SiN). Each memory pillar MP may further include an insulator layer in the semiconductor layer 40, and the insulator layer may be located at the center of the memory pillar MP.

Figure 7:
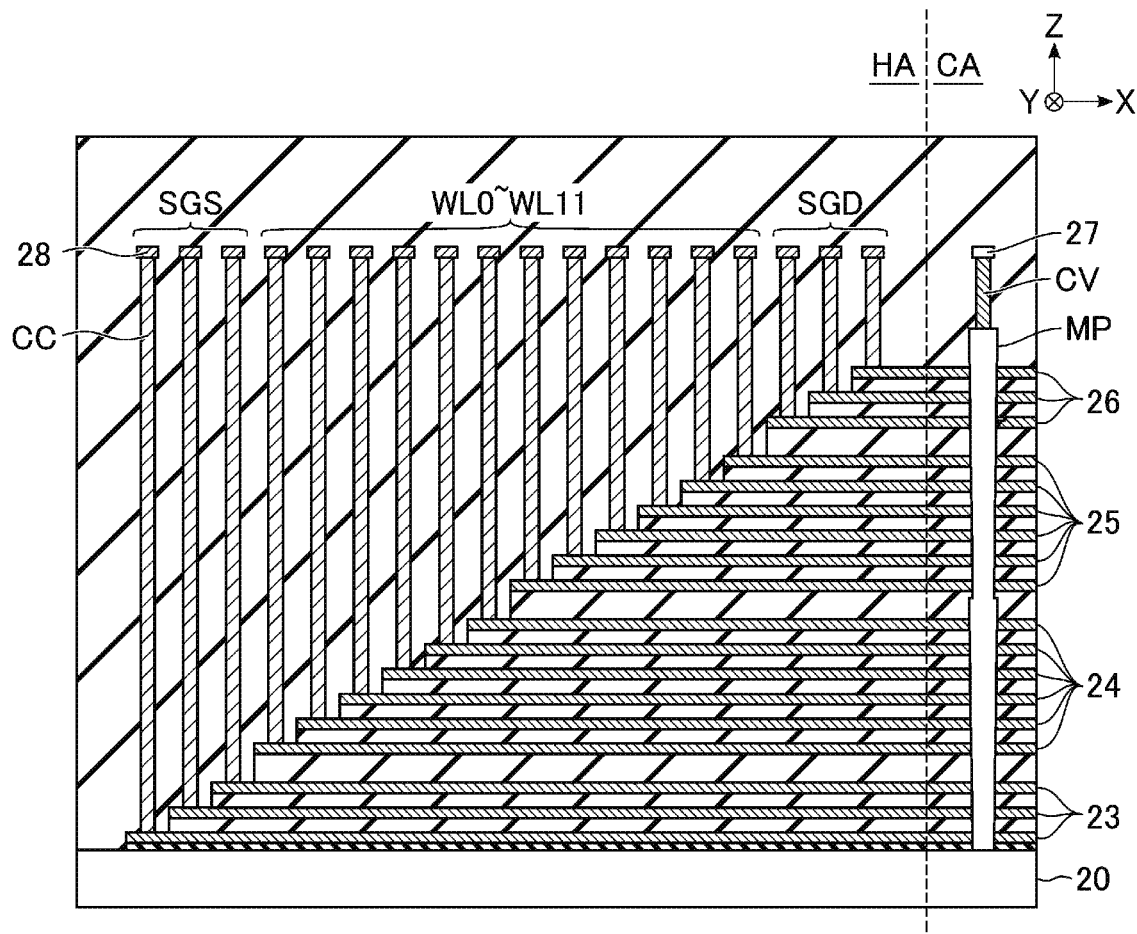
FIG. 7 illustrates a cross-sectional view of an example of a cross-sectional structure in a drawing area in the memory region of the semiconductor memory device according to the embodiment.

FIG. 7 shows an example of a cross-sectional structure in the drawing area HA in the memory region MR of the semiconductor memory device 1 according to the embodiment. FIG. 7 also shows a part of the cell area CA. As shown in FIG. 7, in the drawing area HA, for example, the end portions of the select gate line SGS, the word lines WL0 to WL11, and the select gate line SGD are respectively provided in a stepped shape having a step in the X-direction. In addition, the plurality of contacts CC are respectively provided in respective terrace portions of the conductor layers 23 corresponding to the select gate lines SGS, the plurality of conductor layers 24 respectively corresponding to the word lines WL0 to WL5, the plurality of conductor layers 25 respectively corresponding to the word lines WL6 to WL11, and the plurality of conductor layers 26 corresponding to the select gate lines SGD.

One conductor layer 28 is provided on each contact CC. Each conductor layer 28 is electrically connected to the row decoder module 16 through a region (not shown). That is, each of the conductor layers 23 to 26 is electrically connected to the row decoder module 16 via the contact CC and the conductor layer 28. The conductor layer 28 only needs to be located at least upper than the uppermost conductor layer 26, and may be provided in the same wiring layer as the conductor layer 27.

In the drawing area HA, the stacked wiring may have a step in the Y-direction. For example, the number of steps formed in the Y-direction at the end of the stacked word lines WL may be designed to any number. That is, in the semiconductor memory device 1, the end portion of the word line WL in the drawing area HA may be designed in a stepped shape with any number of columns.

(Regarding the Structure of the Semiconductor Memory Device 1 in the Peripheral Circuit Region PR)

Figure 8:
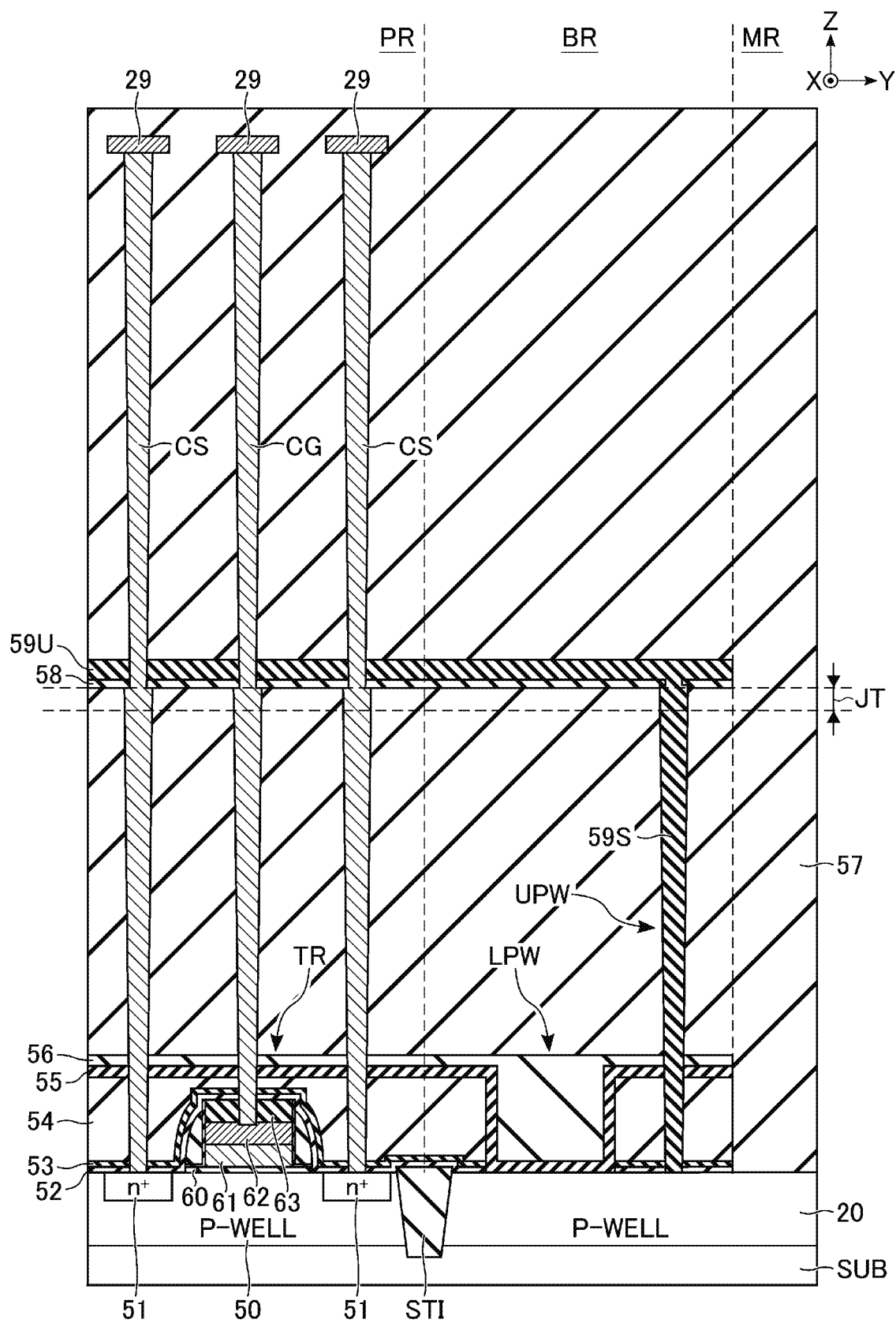
FIG. 8 illustrates a cross-sectional view of an example of a cross-sectional structure in a peripheral circuit region of the semiconductor memory device according to the embodiment.

FIG. 8 shows an example of a cross-sectional structure in the peripheral circuit region PR of the semiconductor memory device 1 according to the embodiment. Further, FIG. 8 also shows the end of the memory region MR, and the boundary region BR between the memory region MR and the peripheral circuit region PR. As shown in FIG. 8, in the peripheral circuit region PR, the semiconductor memory device 1 includes a P-type well region 50, an N-type semiconductor region 51, an insulating region STI, insulating films 52, 53, 55, and 58, insulators 54, 56, 57, and 59, a gate insulating film 60, conductor layers 61 and 62, an insulator layer 63, contacts CS and CG, and a conductor layer 29.

The P-type well region 50 is provided in the vicinity of the surface of the semiconductor substrate SUB. For example, the P-type well region 50 and the P-type well region 20 are separated by the insulating region STI. The N-type semiconductor region 51 is an N-type impurity diffusion region provided in the vicinity of the surface of the P-type well region 50 and corresponds to the source or drain of the N-type transistor TR provided in the peripheral circuit region PR. For example, phosphorus is doped in the N-type semiconductor region 51.

The gate insulating film 60 is provided on the P-type well region 50. On the gate insulating film 60, conductor layers 61 and 62 and the insulator layer 63 are sequentially provided. The side surfaces (side walls) of the conductor layers 61 and 62 and the insulator layer 63 are covered with an insulator. The conductor layers 61 and 62 are used as gate electrodes of the transistors TR.

The insulating films 52 and 53 are sequentially provided in the peripheral circuit region PR and the boundary region BR and on the semiconductor substrate SUB. The insulating film covers the upper and side surfaces of the structure corresponding to the transistor TR, and the upper portion of the insulating region STI. The insulating films 52 and 53 include portions provided along the transistor TR. The insulating film 52 is, for example, an oxide film, and the insulating film 53 is, for example, a silicon nitride film.

An insulator 54 is provided on the insulating film 53. The insulator 54 includes a portion provided along the transistor TR. The upper surface of the insulator 54 is located upper than the insulator 53 above the transistor TR, and flattened. The insulator 54 contains, for example, non-doped silicate glass (NSG). Further, in the boundary region BR, the insulator 54 includes a portion divided by a blocking portion LPW. The blocking portion LPW is a structure for protecting the transistor TR in the peripheral circuit region PR in the manufacturing process of the semiconductor memory device 1.

The insulating film 55 is provided on the insulator 54. In the blocking portion LPW, the insulating film 55 includes a portion provided along the side surfaces of the divided insulator 54, and the P-type well region 20 provided on the bottom of the blocking portion LPW. The insulating film 55 on the insulator 54 and the insulating film 55 of the blocking portion LPW are provided continuously. That is, the insulating film 55 is unbroken or otherwise forms a continuous, uninterrupted film from the portion on the insulator 54 to the portion on the blocking portion LPW. In some contexts, insulating film 55 may be referred to as a continuous film, a conformal film, or a conformally formed film. The thickness of the insulating film 55 is thicker than the insulating film 53, for example. The insulating film 55 is a silicon nitride film, for example.

The insulator 56 is provided on the insulating film 55. The insulator 56 includes a portion provided along the insulating film 55 in the blocking portion LPW, and is filled in the blocking portion LPW. Then, the upper surface of the insulator 56 is flattened. The insulator 56 contains, for example, tetra ethyl ortho silicate (TEOS).

The insulating film 58 is provided on the insulator 56 via the insulator 57. For example, the insulator 57 is used as an insulator layer for eliminating a step between a structure provided in the memory region MR and a structure provided in the peripheral circuit region PR. The insulator 57 contains, for example, NSG. The insulating film 58 is located upper than the junction layer JT, for example. The insulating film 58 is, for example, a silicon oxide film.

An insulator 59 is provided on the insulating film 58. The insulator 59 includes a portion provided on the insulating film 58 (hereinafter referred to as an insulator 59U) and a portion obtained by dividing the insulating films 52, 53, 55 and 58 and the insulators 54 and 56 in the boundary region BR (hereinafter referred to as an insulator 59S or a blocking portion UPW). The insulator 59S is provided in a plate shape extending along the boundary region BR, and the bottom of the insulator 59S is in contact with the surface of the semiconductor substrate SUB (for example, the P-type well region 20). The transistor TR in the peripheral circuit region PR and the blocking portion LPW in the boundary region BR are surrounded by the semiconductor substrate SUB and the insulator 59. In other words, the region of the insulator 57 provided on the transistor TR side with respect to the insulator 59 and the region of the insulator 57 provided on the memory region MR side are separated by the insulator 59. The insulator 59 is, for example, a silicon nitride film.

The contact CS has a columnar structure extending in the Z-direction, and is provided through the insulating films 52, 53, 55, and 58 and the insulators 54, 56, and 59. The upper surface of the contact CS is located upper than the upper surface of the slit SLT, and the bottom of the contact CS is in contact with the N-type semiconductor region 51. For example, in the junction layer JT, the contact CS has a shape similar to that of the memory pillar MP.

The contact CG has a columnar structure extending in the Z-direction, and is provided through the insulating films 52, 53, 55, and 58, the insulators 54, 56, and 59, and the insulator layer 63. The upper surface of the contact CG is aligned with the upper surface of the contact CS, and the bottom of the contact CS is in contact with the conductor layer 62. For example, in the junction layer JT, the contact CG has a shape similar to the memory pillar MP, similarly to the contact CS.

One conductor layer 29 is provided on each of the contacts CS and CG. The conductor layer 29 is wiring used for controlling the transistor TR. The conductor layer 29 is provided in the same layer as the conductor layer 28, for example. Other contacts and wirings may be connected to each conductor layer 29.

Figure 9:
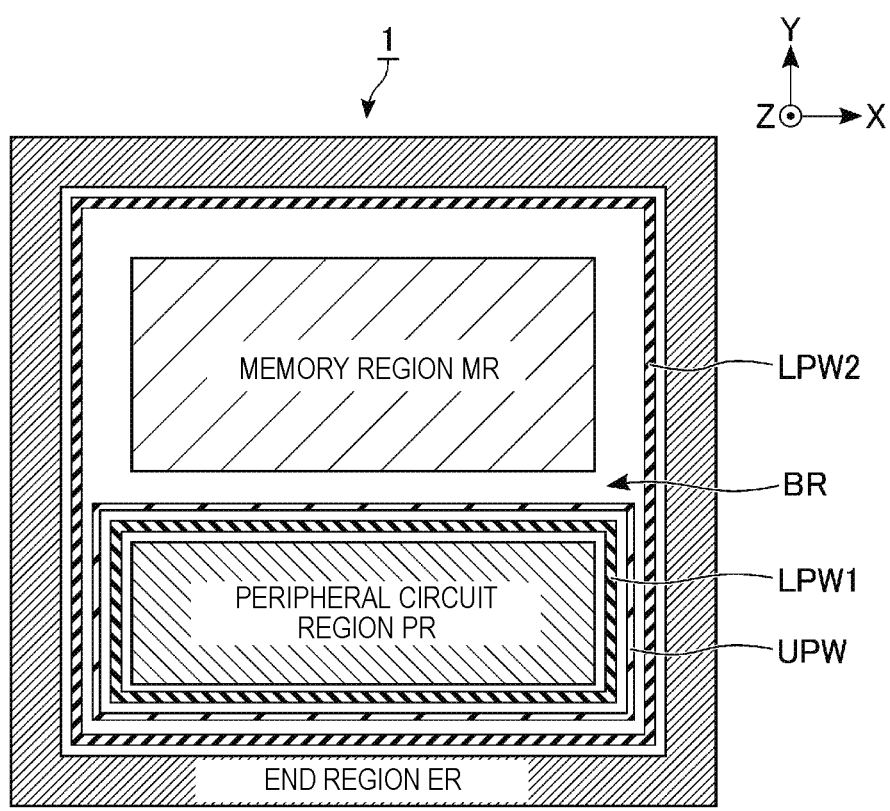
FIG. 9 illustrates a plan view of an example of a planar layout of a blocking portion in the semiconductor memory device according to the embodiment.

FIG. 9 shows an example of a planar layout of the blocking portions PW in the semiconductor memory device 1 according to the embodiment. As shown in FIG. 9, in the boundary region BR, the semiconductor memory device 1 includes, for example, two blocking portions LPW1 and LPW2, and one blocking portion UPW. The blocking portion LPW1 surrounds the periphery of the peripheral circuit region PR. The blocking portion LPW2 surrounds the peripheries of the memory region MR and the peripheral circuit region PR. The blocking portion LPW1 is surrounded by, for example, the blocking portion LPW2. The blocking portion UPW surrounds the peripheries of the peripheral circuit region PR and the blocking portion LPW1.

In the semiconductor memory device 1 according to the embodiment, at least each one of the blocking portions LPW and UPW may be provided. In the embodiment, it is sufficient that at least the peripheral circuit region PR, each of the memory region MR and the end region ER are separated by the blocking portion LPW. Further, it is sufficient that the blocking portion UPW separates at least the peripheral circuit region PR, and each of the memory region MR and the end region ER, and preferably also surrounds the blocking portion LPW. The planar shape of each of the blocking portions LPW and UPW is not limited to a square annular shape, and may be designed in any shape.

[1-2] Manufacturing Method of Semiconductor Memory Device 1

Figure 10:
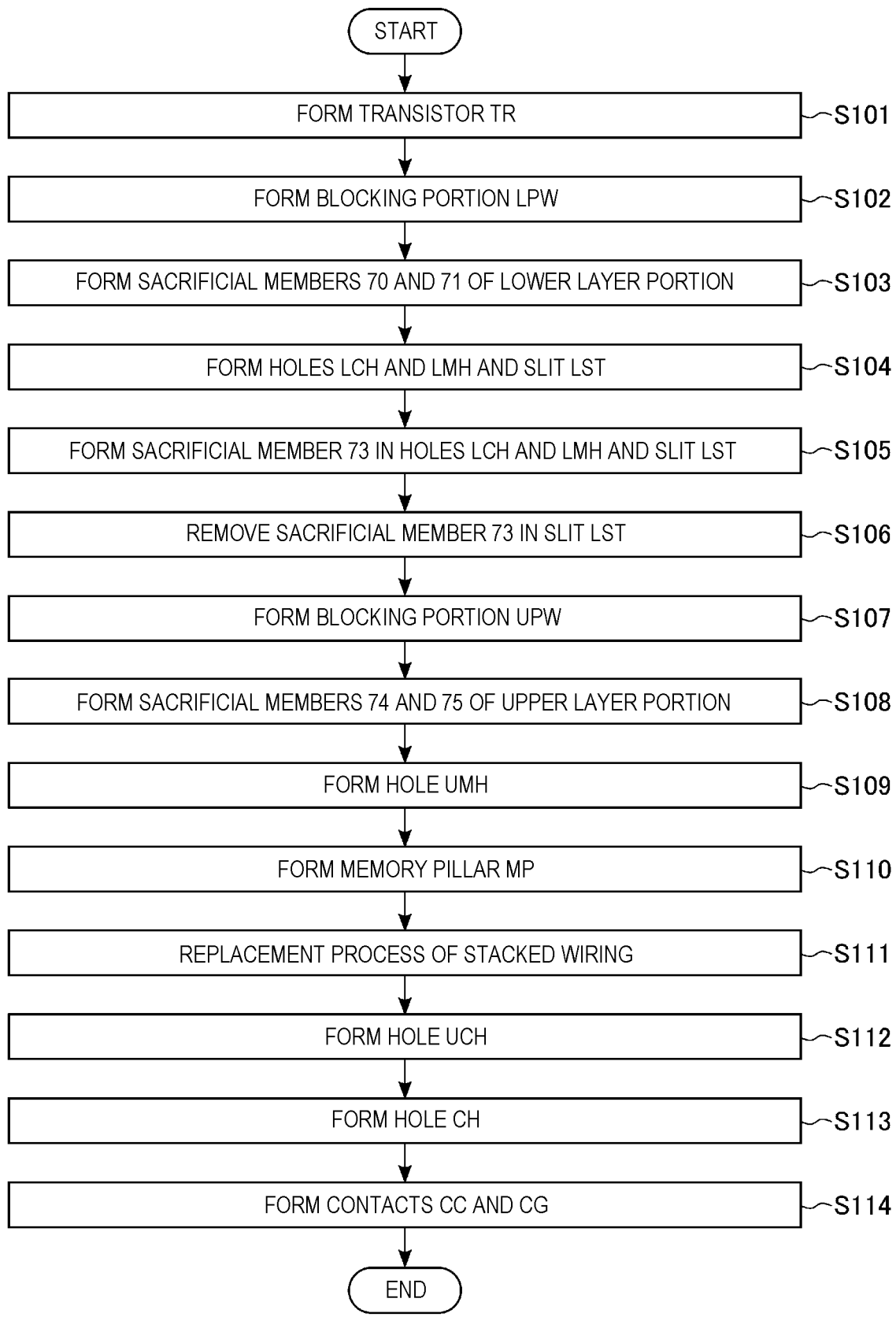
FIG. 10 is a flowchart showing an example of a manufacturing method of the semiconductor memory device according to the embodiment.

Hereinafter, an example of a series of manufacturing processes from the formation of the transistor TR to the formation of the contact CG in the semiconductor memory device 1 according to the embodiment will be described with reference to FIG. 10 as appropriate. FIG. 10 is a flowchart showing an example of the manufacturing method of the semiconductor memory device 1 according to the embodiment. Each of FIGS. 11 to 26 is an example of a cross-sectional structure in the process of manufacturing the semiconductor memory device 1 according to the embodiment, and shows an extracted part of the memory region MR, the boundary region BR, and the peripheral circuit region PR. In the following description of the manufacturing method, since the manufacturing processes of the contacts CC and CG connected to the transistor TR are similar, the manufacturing method of the contact CG will be described as a representative, and the illustration of the structure related to the contact CS will be omitted.

Figure 11:
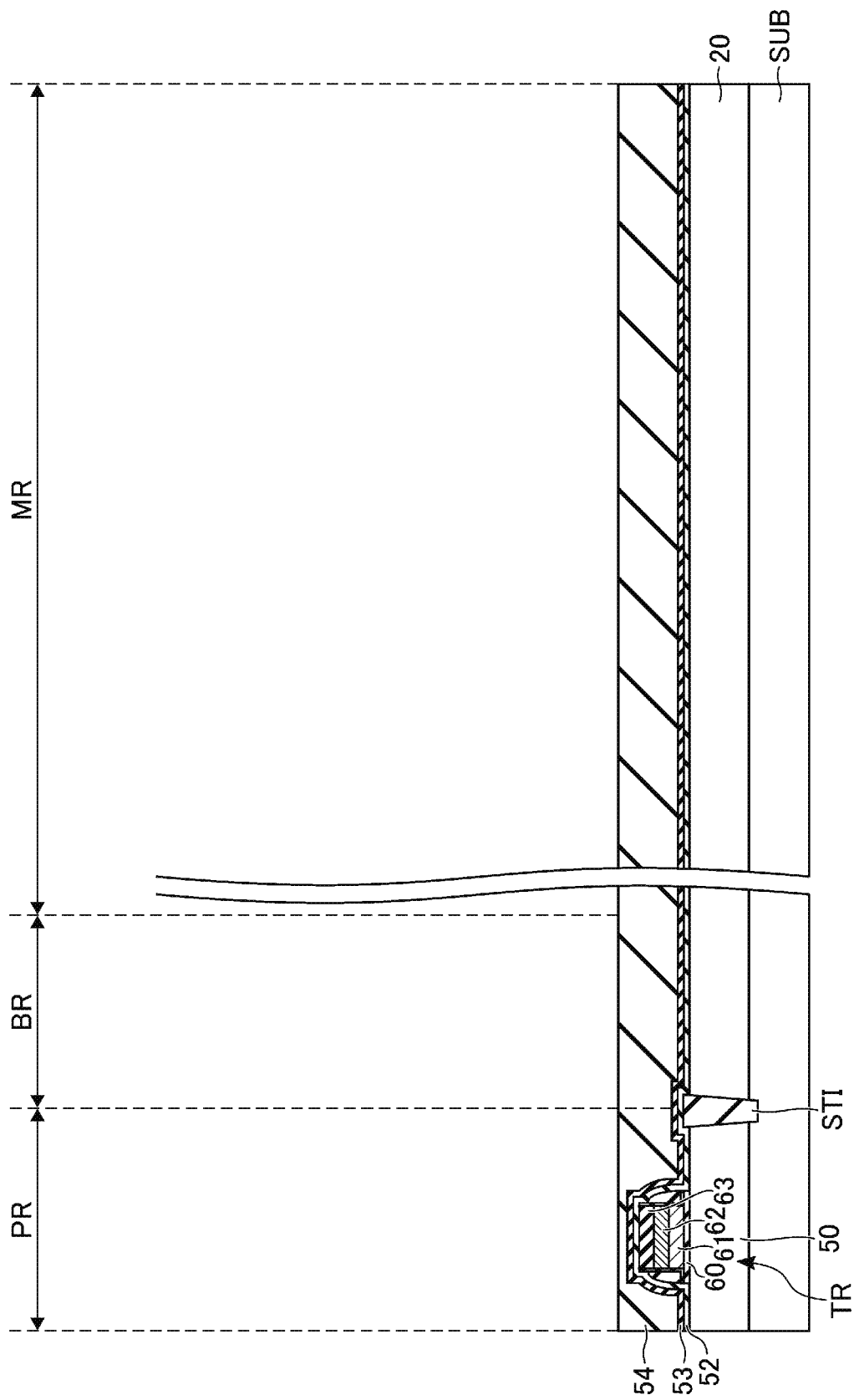
FIGS. 11-29 are cross-sectional views for explaining aspects of a manufacturing a semiconductor memory device according to an embodiment.

First, as shown in FIG. 11, the transistor TR is formed (step S101). Specifically, first, the P-type well regions 20 and 50 are formed on the surface of the semiconductor substrate SUB, and the P-type well regions 20 and 50 are divided by the insulating region STI. Then, the gate insulating film 60, the conductor layers 61 and 62, and the insulator layer 63 are sequentially formed, and the gate insulating film 60, the conductor layers 61 and 62, and the insulator layer 63 are processed according to the shape of the transistor TR. Then, an insulator is formed on the side wall of the transistor TR, and the insulating films 52 and 53 and the insulator 54 are sequentially formed. At this time, a step is formed in the insulator 54 in accordance with the shape of the transistor TR, and thus the upper surface of the insulator 54 is flattened by, for example, the chemical mechanical polishing (CMP).

Figure 12:
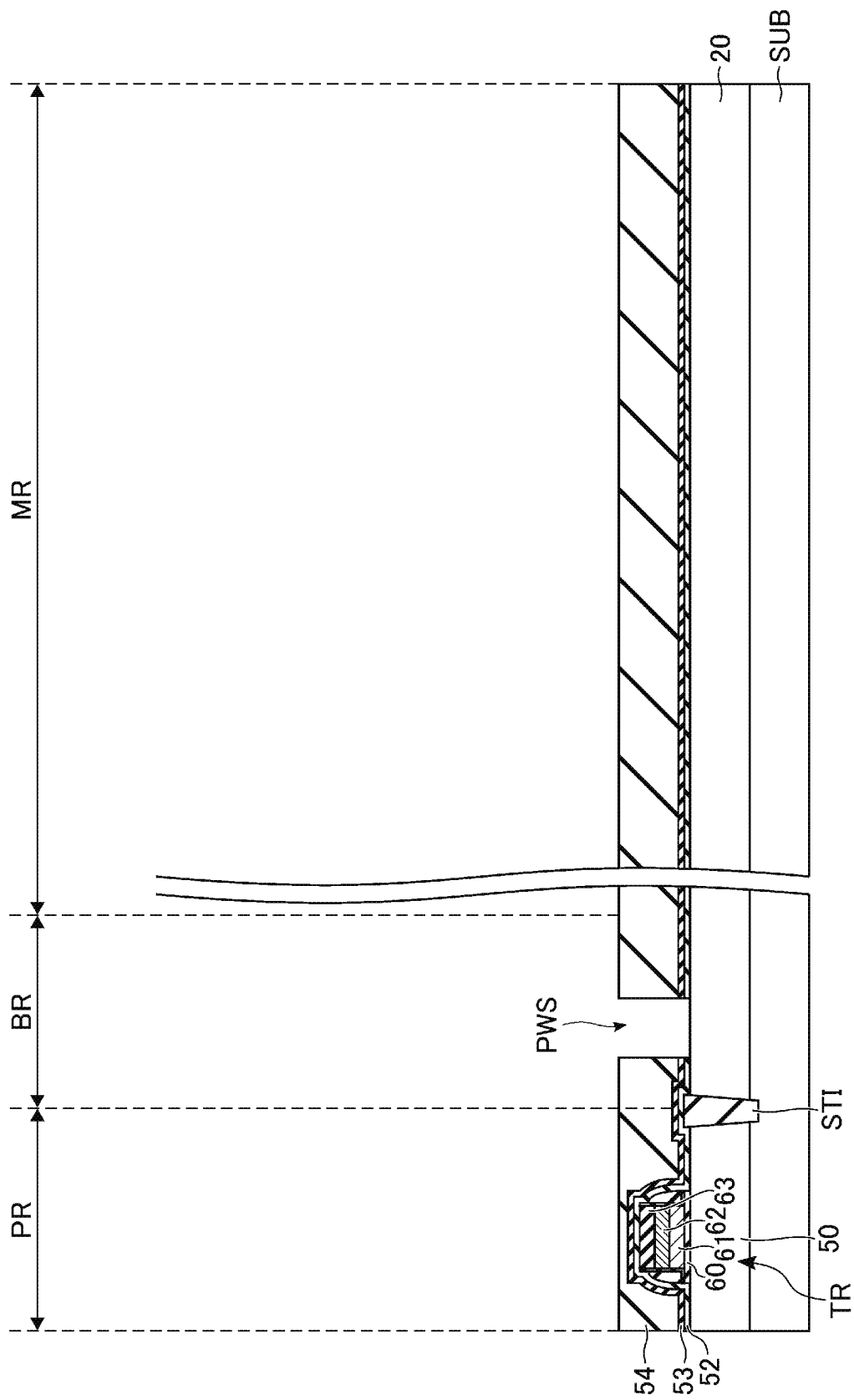

Next, the blocking portion LPW is formed (step S102). Specifically, first, a mask having an opening region corresponding to the blocking portion LPW in the boundary region BR is formed by photolithography or the like. Then, a slit PWS is formed as shown in FIG. 12 by etching using the mask. The slit PWS divides the insulating films 52 and 53, and the insulator 54, and a part of the P-type well region 20 is exposed at the bottom of the slit PWS.

Figure 13:
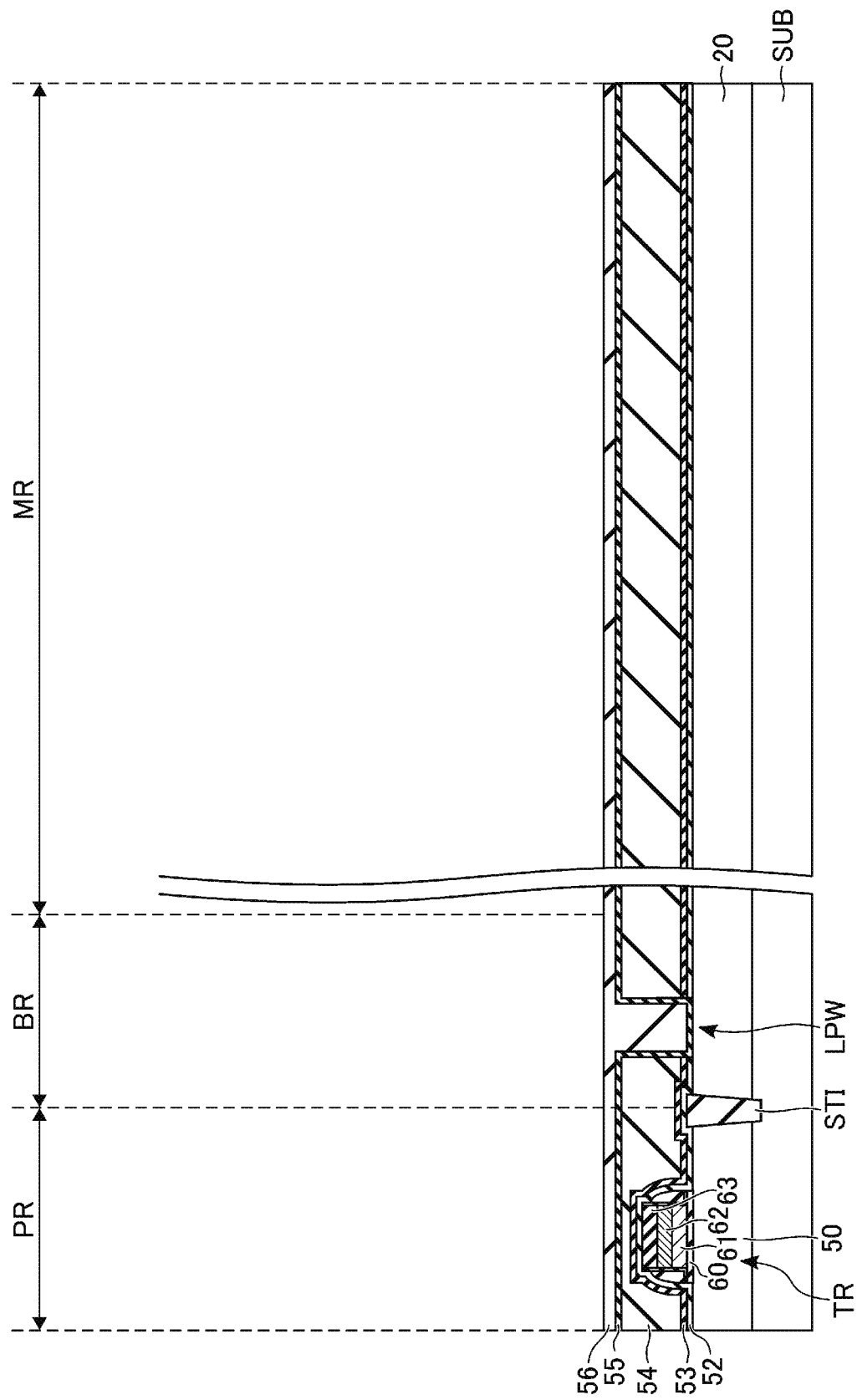

Then, the insulator 56 is formed on the insulating film 55, and the slit PWS is filled with the insulator 56. At this time, since a step is formed according to the shape of the slit PWS, the upper surface of the insulator 56 is flattened by CMP, for example, as shown in FIG. 13.

Figure 14:
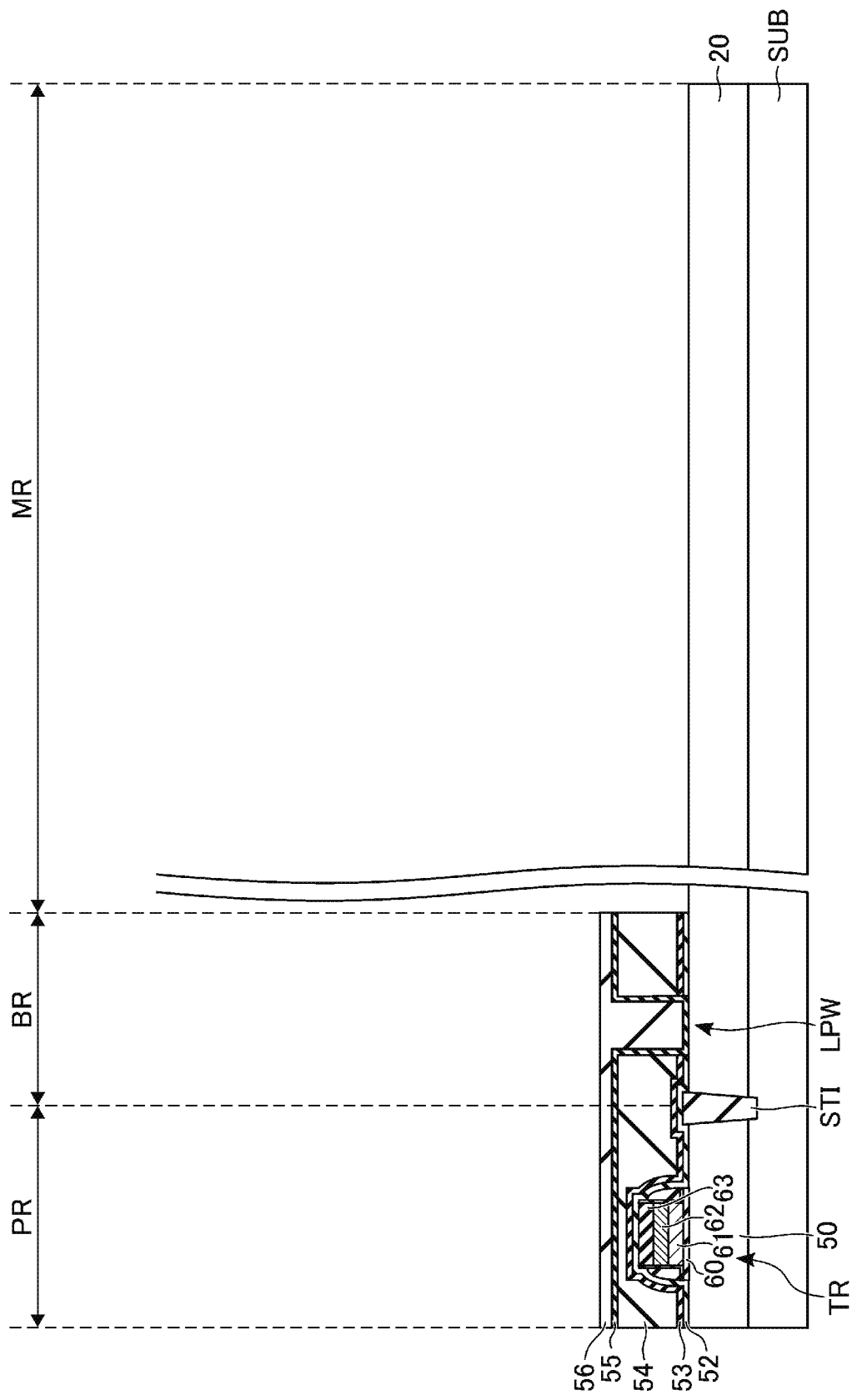

Next, sacrificial members 70 and 71 of the lower layer portion are formed (step S103). Specifically, a mask having an opening in the memory region MR is first formed by photolithography or the like. Then, as shown in FIG. 14, the insulating films 52, 53, and 55 and the insulators 54 and 56 in the memory region MR are removed by anisotropic etching using the mask.

Figure 15:
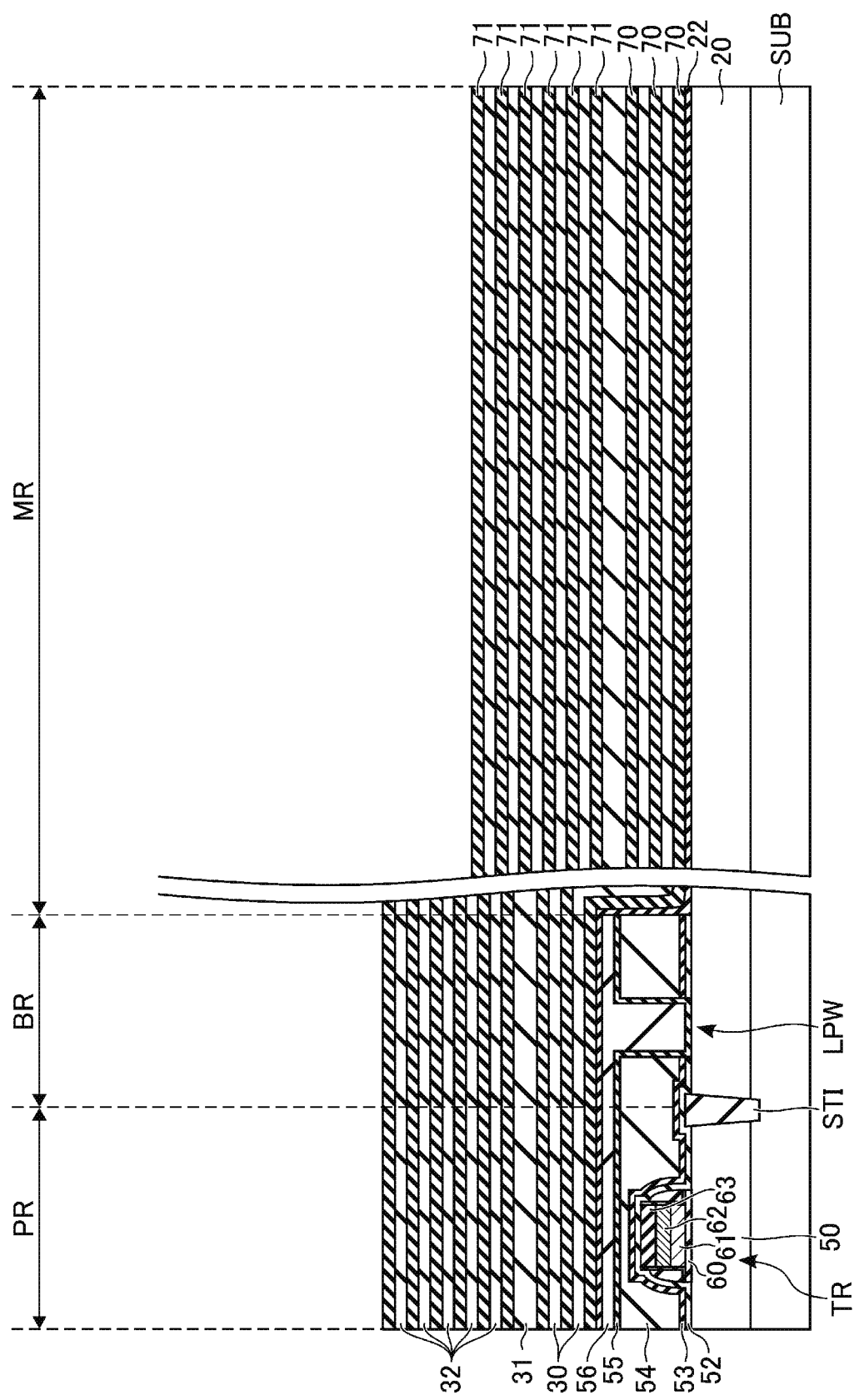

Then, the insulator layer 22 is formed, and the sacrificial members 70 and the insulator layers 30 are alternately stacked on the insulator layer 22. Subsequently, the insulator layer 31 is formed on the uppermost sacrificial member 70, and the sacrificial members 71 and the insulator layers 32 are alternately stacked on the insulator layer 31. As a result, as shown in FIG. 15, the sacrificial members 70 and 71 of the lower layer portion are formed in the memory region MR. In this step, the sacrificial members 70 and 71 are also formed above the transistor TR in the peripheral circuit region PR and above the blocking portion LPW in the boundary region BR.

Figure 16:
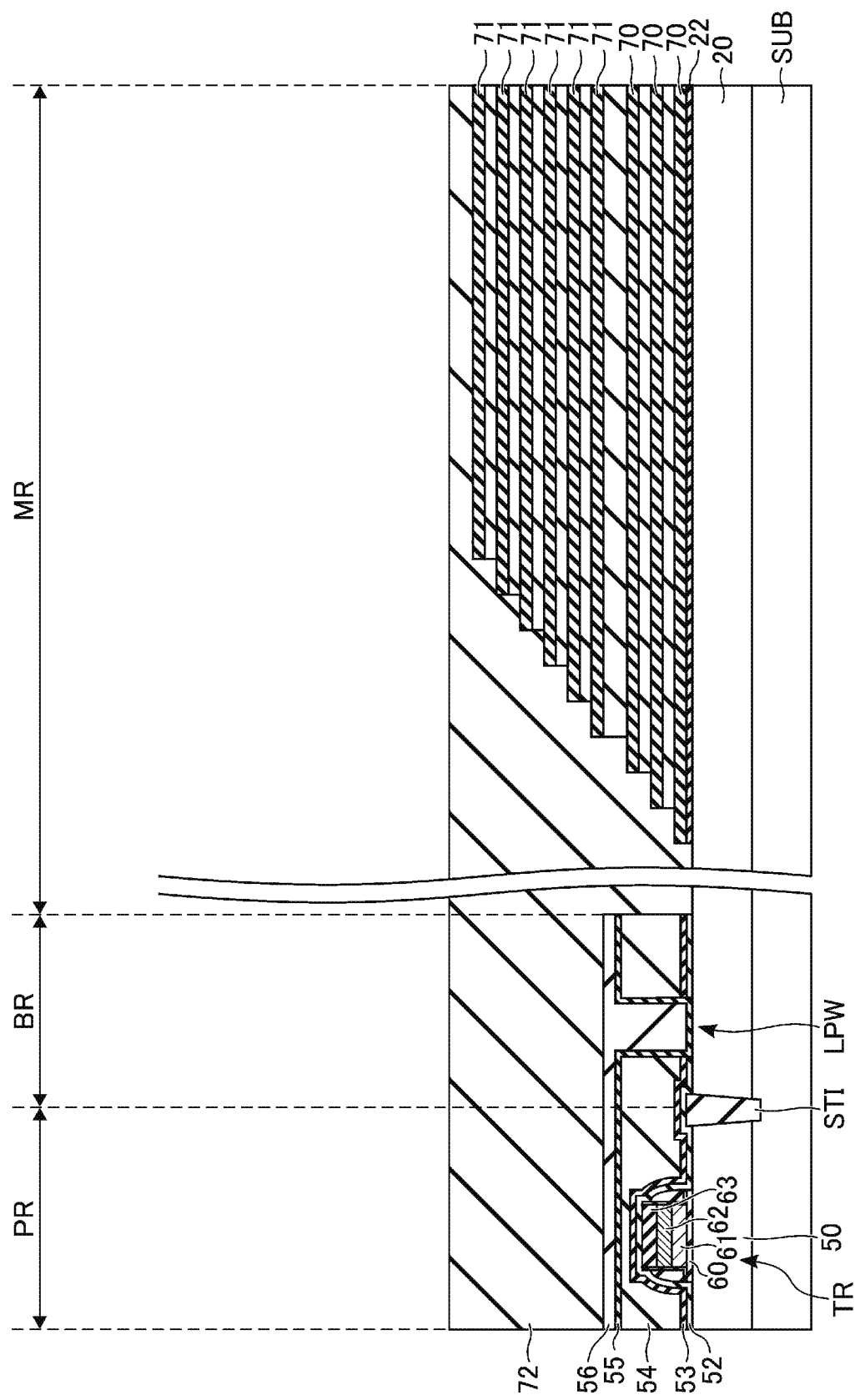

Thereafter, the end portions of the sacrificial members 70 and 71 in the memory region MR are processed into a stepped shape by the step processing of the lower layer portion, and the sacrificial members 70 and 71 in the boundary region BR and the peripheral circuit region PR are removed. Then, the insulator 72 is formed, and the step formed by the step processing of the lower layer portion is buried by the insulator 72, and the upper surface of the insulator 72 is flattened as shown in FIG. 16.

Figure 17:
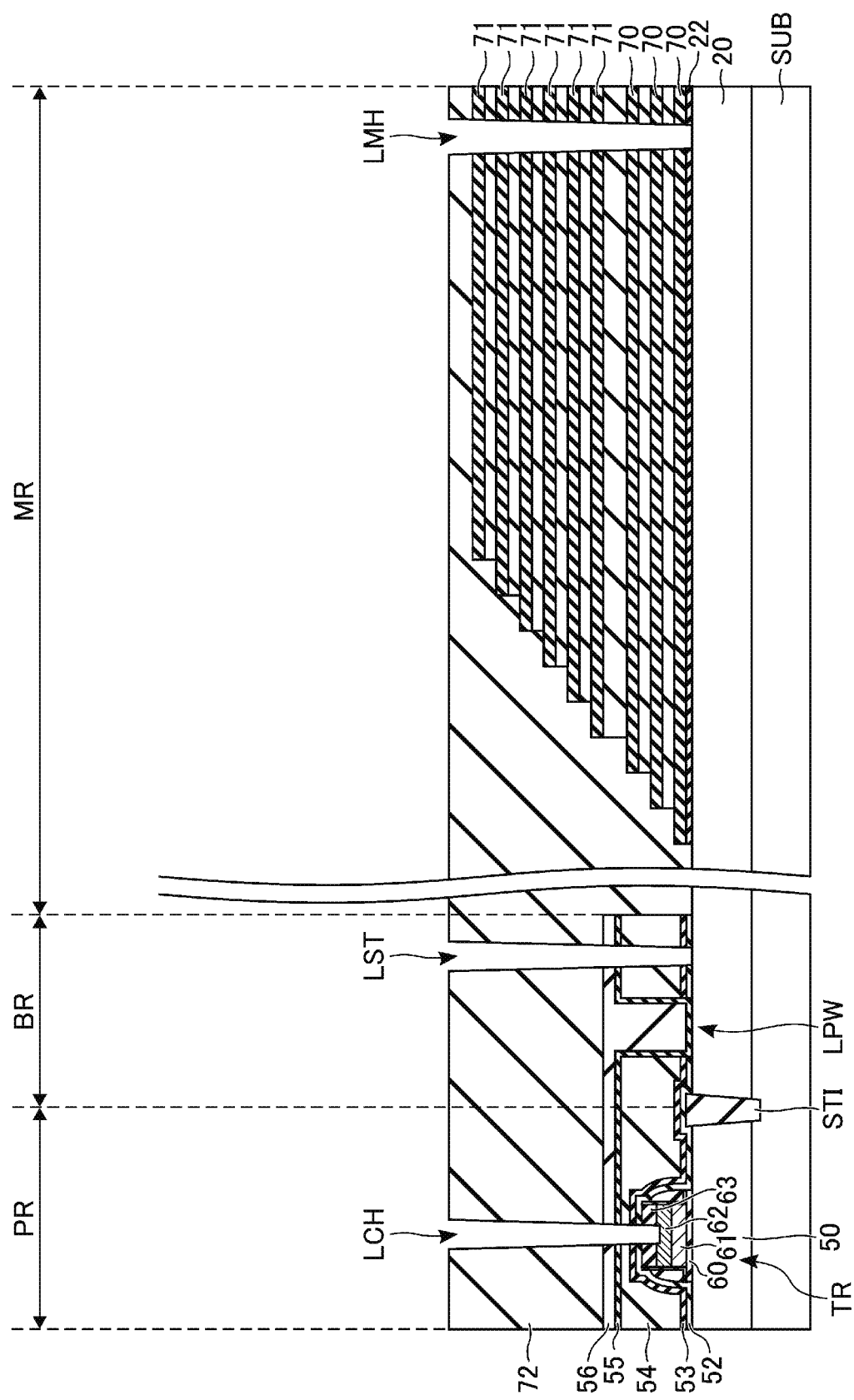

Next, holes LCH and LMH, and a slit LST are formed (step S104). Specifically, first, a mask having an opening region corresponding to the contact CG, the memory pillar MP, and the blocking portion UPW is formed by photolithography or the like. Then, the hole LCH corresponding to the contact CG and the hole LMH corresponding to the memory pillar MP, the slit LST corresponding to the blocking portion UPW are formed as shown in FIG. 17 by anisotropic etching using the mask. The hole LCH penetrates the insulator layer 63, the insulating films 52, 53, and 55, and the insulators 54, 56, and 72, and a part of the conductor layer 62 is exposed at the bottom of the hole LCH. The hole LMH penetrates the insulator layer 22, the sacrificial members 70 and 71, and the insulator 72, and a part of the P-type well region 20 is exposed at the bottom of the hole LMH. The slit LST divides the insulating films 52, 53, and 55, and the insulators 54, 56, and 72, and a part of the P-type well region 20 is exposed at the bottom of the slit LST.

Figure 18:
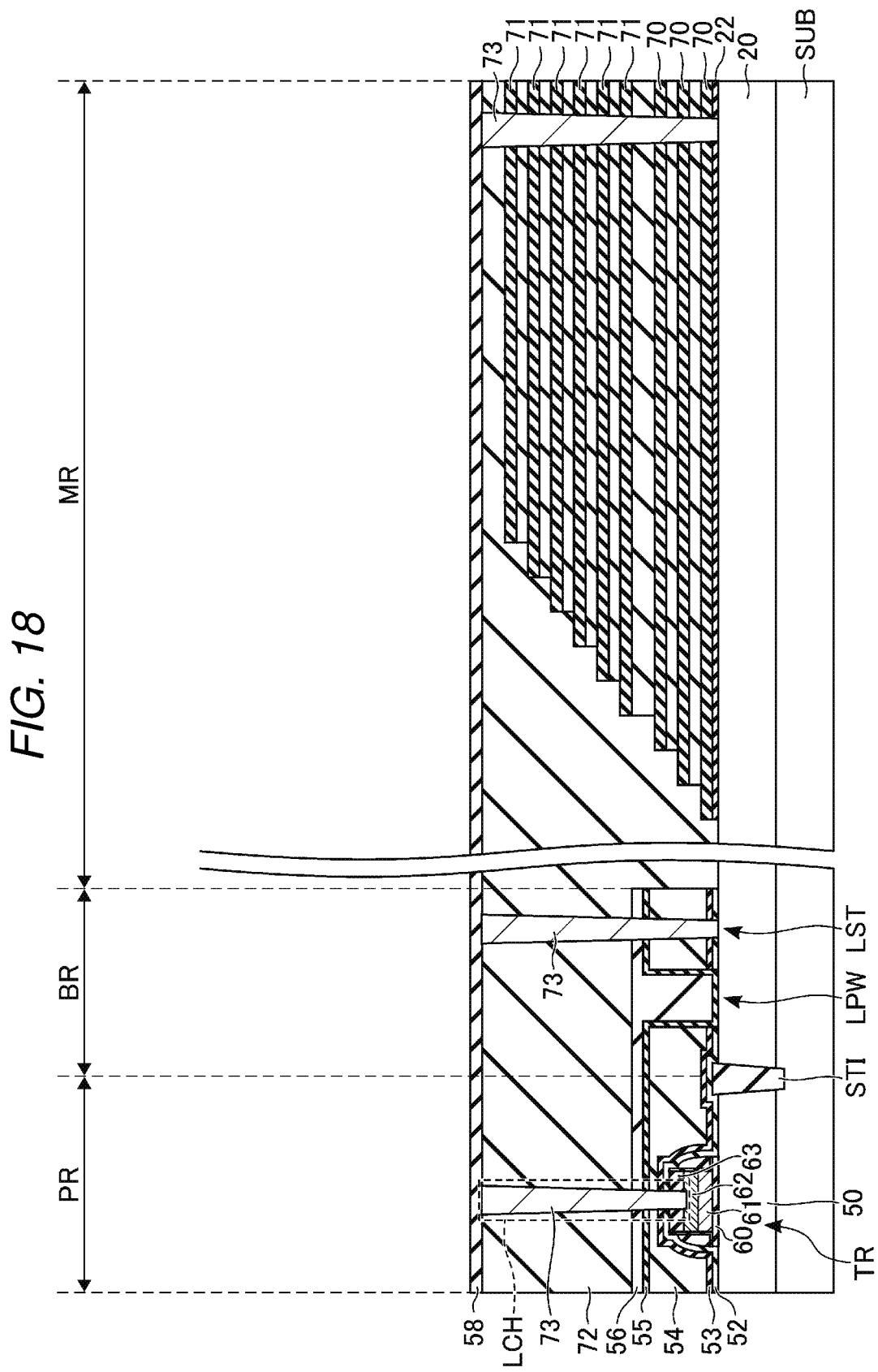

Next, a sacrificial member 73 is formed in the holes LCH and LMH and the slit LST (step S105). Specifically, the sacrificial member 73 is formed on the insulator 72, and the sacrificial member 73 is filled in the holes LCH and LMH and the slit LST. Then, the sacrificial member 73 formed outside the holes LCH and LMH and the slit LST is removed, for example, by CMP. Thereafter, as shown in FIG. 18, the insulating film 58 is formed on the insulator 72 and the sacrificial member 73.

Figure 19:
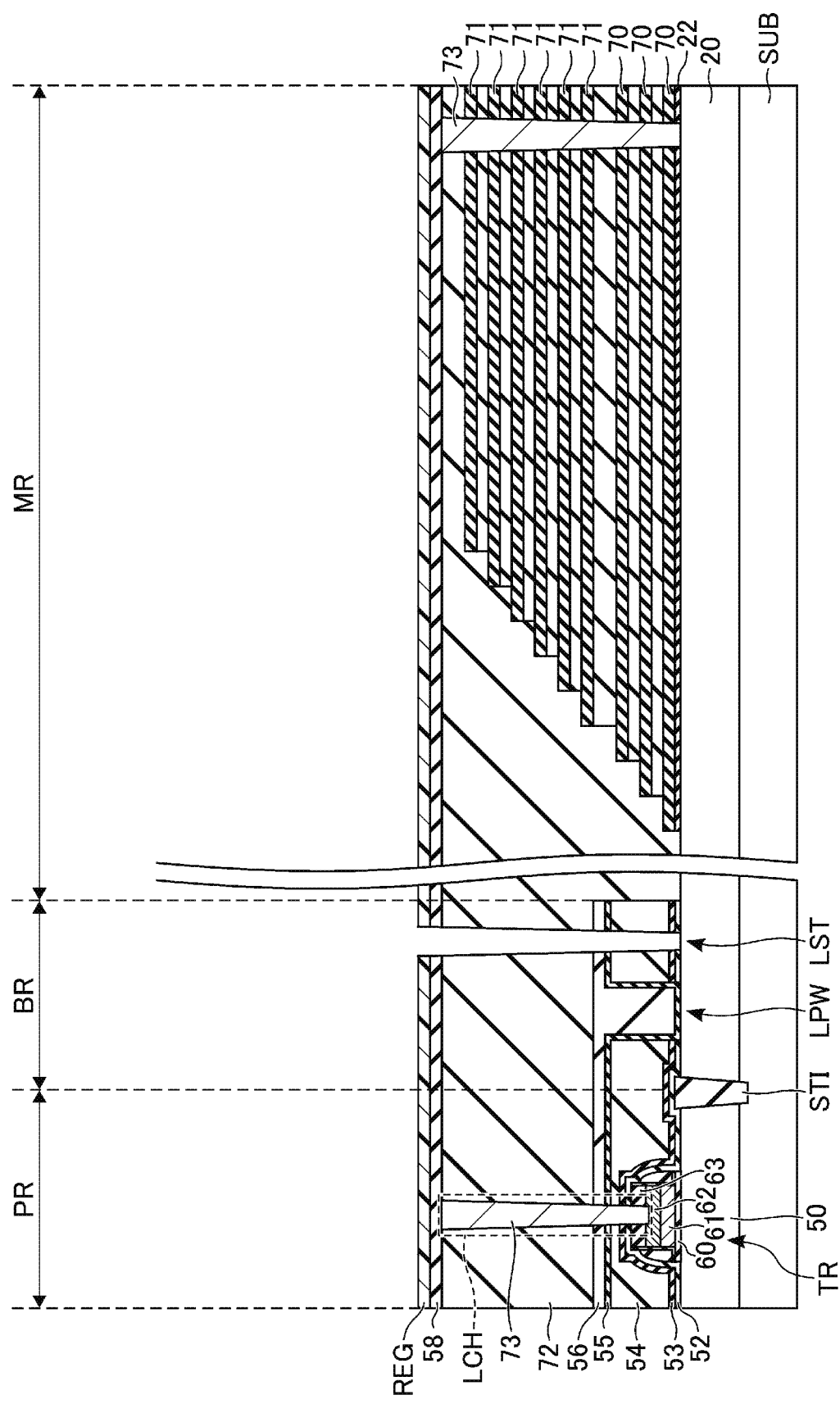

Next, the sacrificial member 73 in the slit LST is removed (step S106). Specifically, first, a mask REG is formed by photolithography or the like to expose the sacrificial member 73 in the slit LST. Then, for example, as shown in FIG. 19, the sacrificial member 73 provided in the slit LST is selectively removed by wet etching through the mask REG. The mask REG is removed after the sacrificial member 73 is selectively removed.

Figure 20:
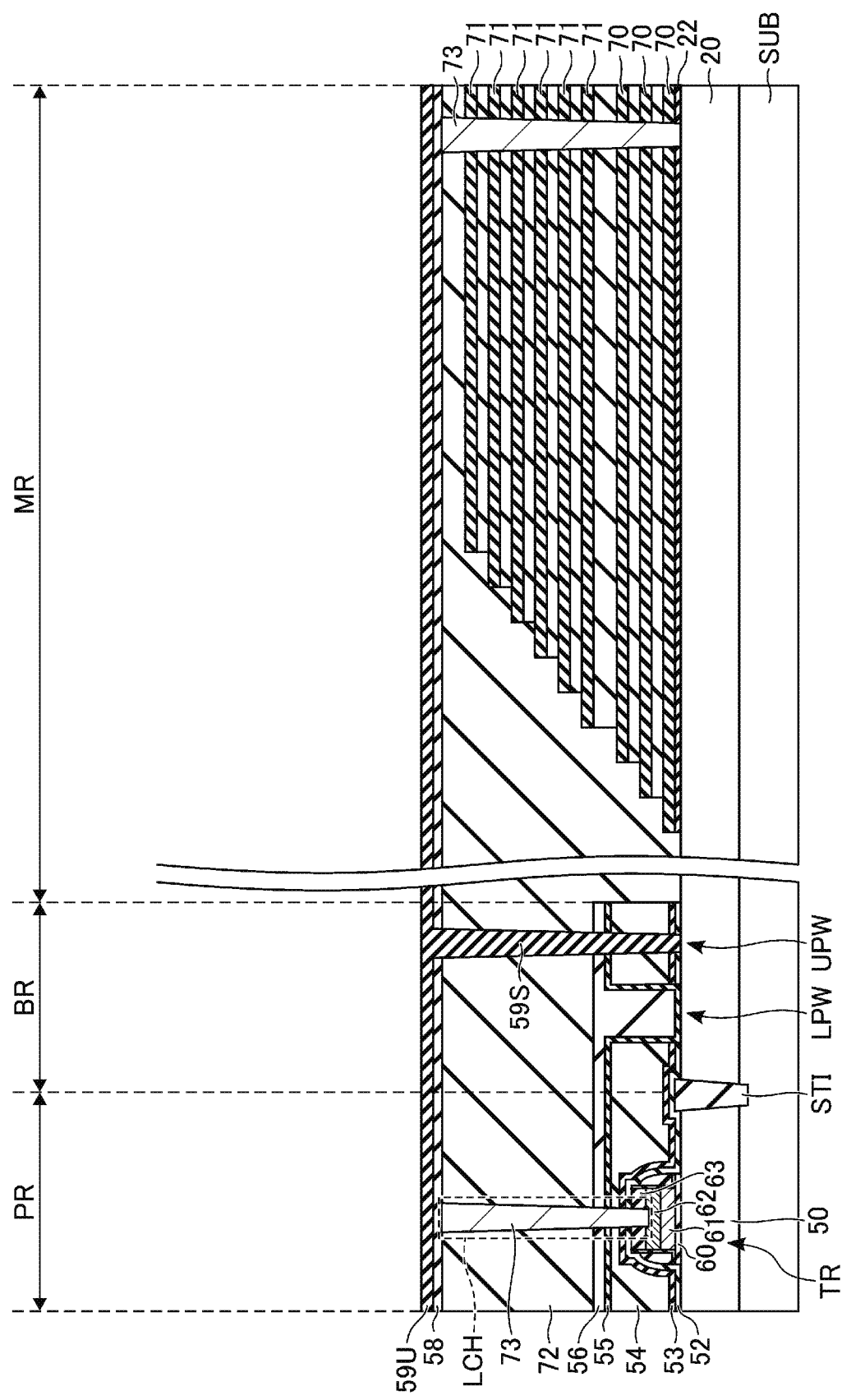
Figure 21:
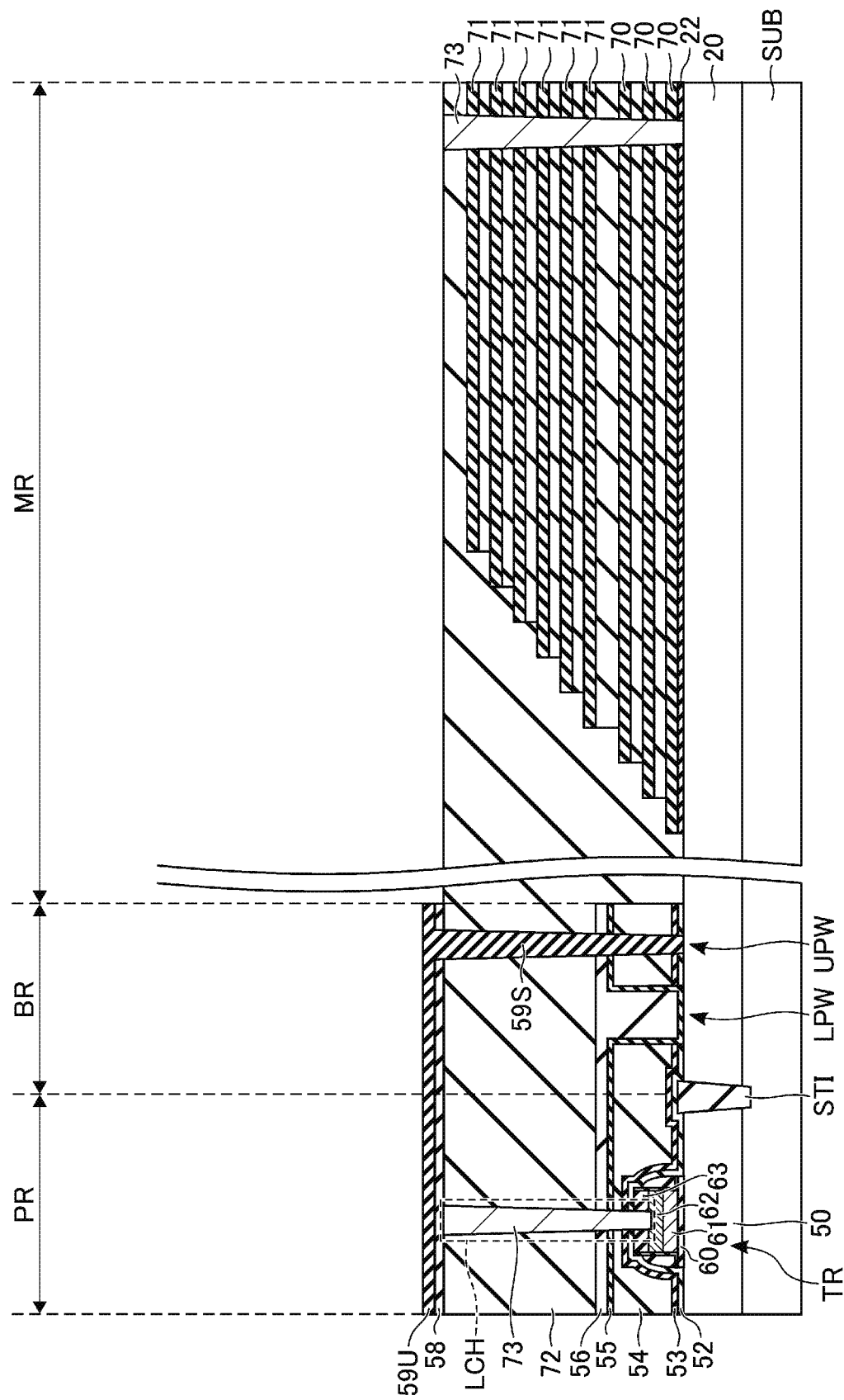

Next, the blocking portion UPW is formed (step S107). Specifically, first, the insulator 59 is formed on the insulating film 58, and the slit LST is filled with the insulator 59. Then, the upper surface of the insulator 59 is flattened, for example, by CMP. As a result, as shown in FIG. 20, the insulators 59U and 59S, that is, the blocking portion UPW is formed.

Figure 22:
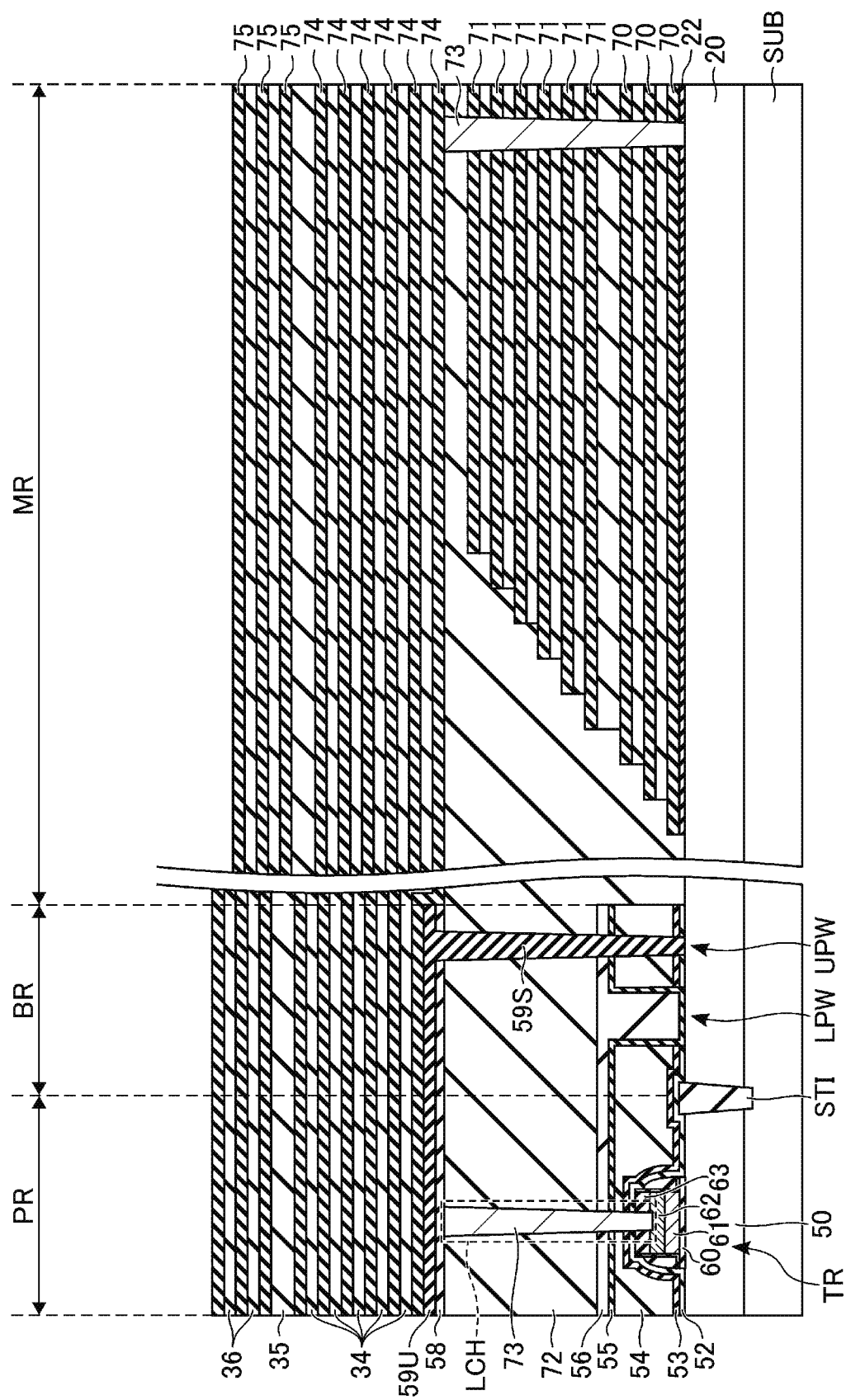

Next, sacrificial members of the upper layer portion are formed (step S108). Specifically, sacrificial members 74 and the insulator layers 34 are alternately stacked on the insulators 59U and 72, and the sacrificial member 73 in the hole LMH. Subsequently, the insulator layer 35 is formed on the uppermost sacrificial member 74, and sacrificial members 75 and the insulator layers 36 are alternately stacked on the insulator layer 35. As a result, as shown in FIG. 22, the sacrificial members 74 and 75 of the upper layer portion are formed in the memory region MR. In this step, the sacrificial members 74 and 75 are also formed above the transistor TR in the peripheral circuit region PR and above the blocking portions LPW and UPW in the boundary region BR.

Figure 23:
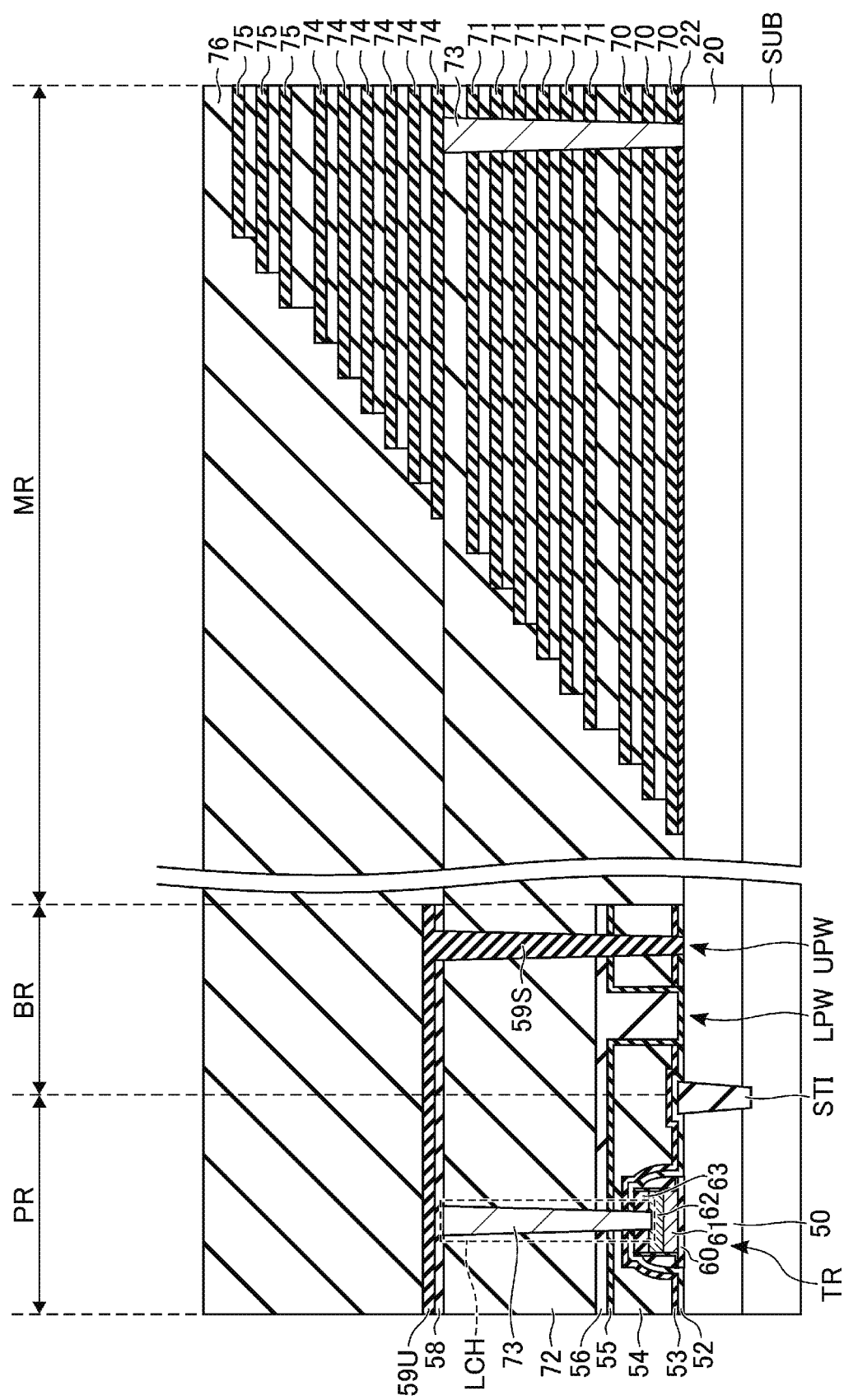

Thereafter, the end portions of the sacrificial members 74 and 75 in the memory region MR are processed into a stepped shape by the step processing of the upper layer portion, and the sacrificial members 74 and 75 in the boundary region BR and the peripheral circuit region PR are removed. Then, an insulator 76 is formed, and the step formed by the step processing of the upper layer portion is buried with the insulator 76, and the upper surface of the insulator 76 is flattened as shown in FIG. 23.

Figure 24:
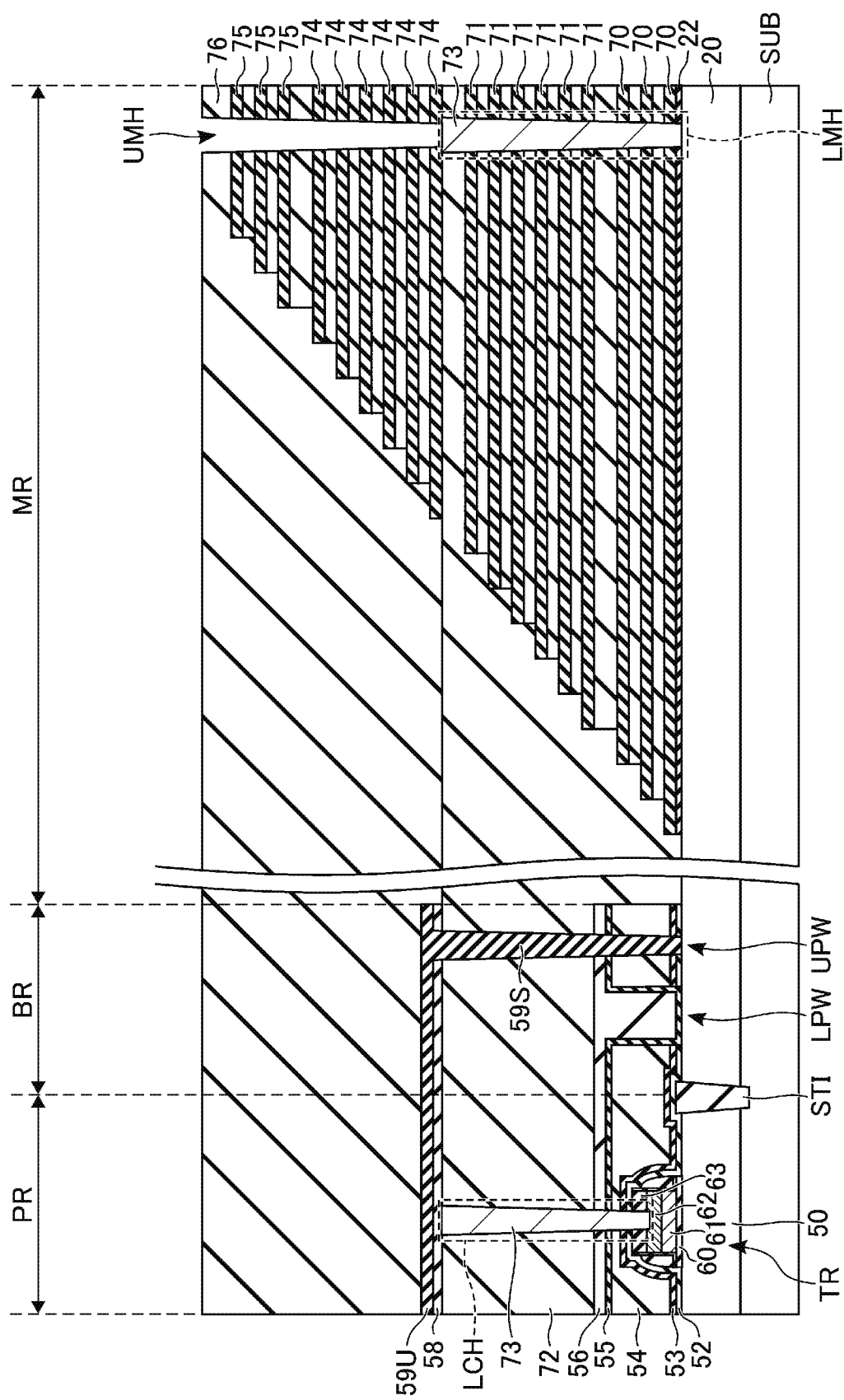

Next, the hole UMH is formed (step S109). Specifically, first, a mask having an opening region corresponding to the memory pillar MP is formed by photolithography or the like. Then, the hole UMH corresponding to the memory pillar MP as shown in FIG. 24 is formed by anisotropic etching using the mask. The hole UMH penetrates the sacrificial members 74 and 75 and the insulator 76, and a part of the sacrificial member 73 in the hole LMH is exposed at the bottom of the hole UMH.

Figure 25:
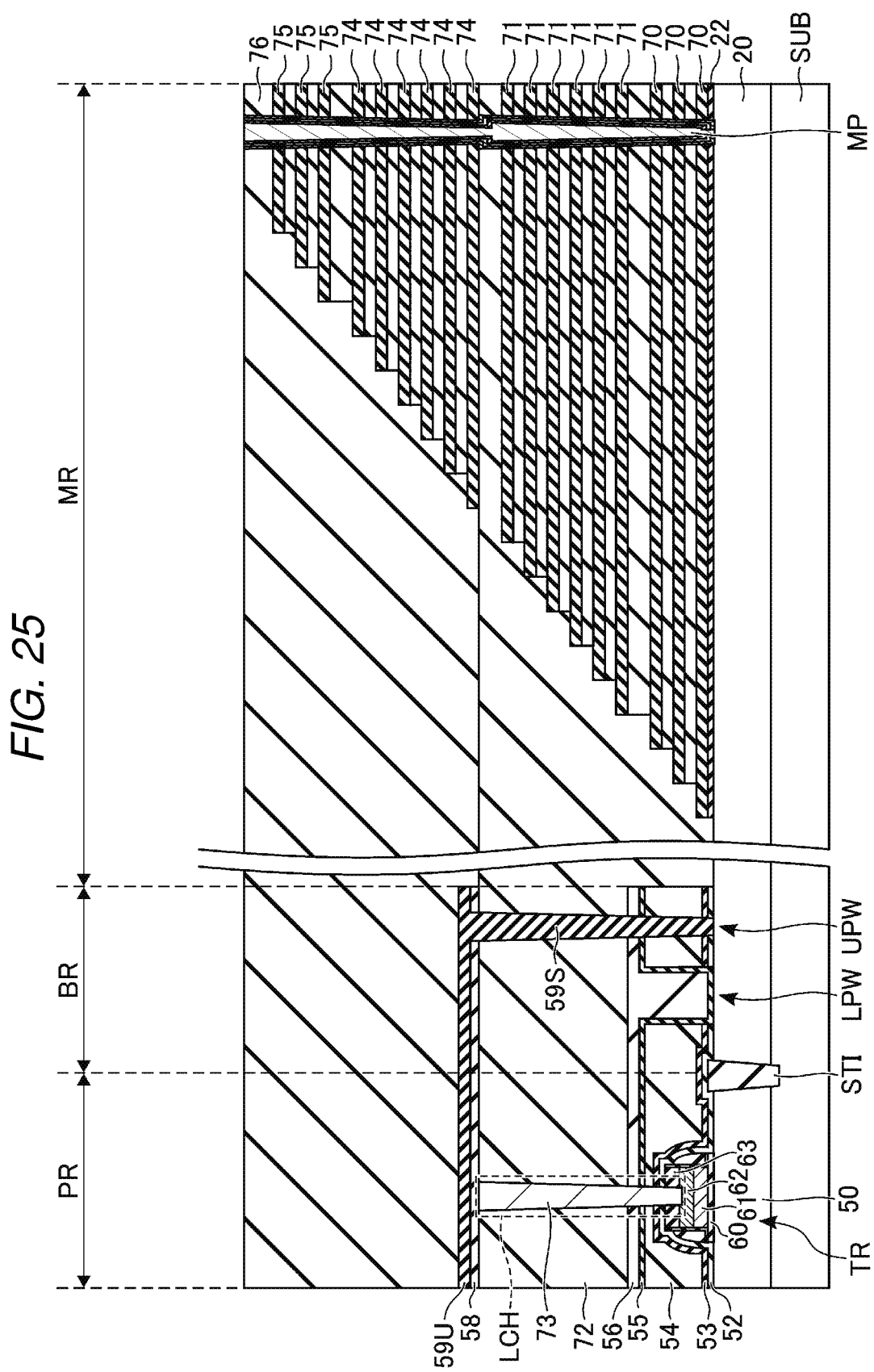

Next, the memory pillar MP is formed (step S110). Specifically, first, the sacrificial member 73 in the hole LMH is removed through the hole UMH by wet etching. Then, the block insulating film 43, the insulating film 42, and the tunnel insulating film 41 are sequentially formed on the side and bottom surfaces of the connected holes LMH and UMH. Thereafter, the block insulating film 43, the insulating film 42, and the tunnel insulating film 41 at the bottom of the hole LMH are partially removed, and the holes LMH and UMH are filled with the semiconductor layer 40. As a result, as shown in FIG. 25, the memory pillar MP is formed in the connected holes LMH and UMH.

Next, the replacement process of the stacked wiring is executed (step S111). Specifically, first, an insulator layer 77 is formed on the insulator 76. Then, a mask having an opening region corresponding to the slit SLT is formed by photolithography or the like, and the slit SLT is formed by anisotropic etching using the mask. The slit SLT divides the sacrificial members 70, 71, 74, and 75, the insulator 76, and the insulator layer 77. Then, the sacrificial members 70, 71, 74, and 75 are selectively removed through the slits SLT, for example, by wet etching using hot phosphoric acid. At this time, the three-dimensional structure of the structure from which the sacrificial members 70, 71, 74, and 75 are removed is maintained by the memory pillar MP or the like.

Then, a conductor is filled through the slit SLT in the space from which the sacrificial members 70, 71, 74, and 75 are removed. For example, the chemical vapor deposition (CVD) is used for forming the conductor in this step. Thereafter, the conductor formed inside the slit SLT is removed by an etch-back process. In this step, it is sufficient as long as the conductors formed in the adjacent wiring layers are separated at least in the slit SLT.

Figure 26:
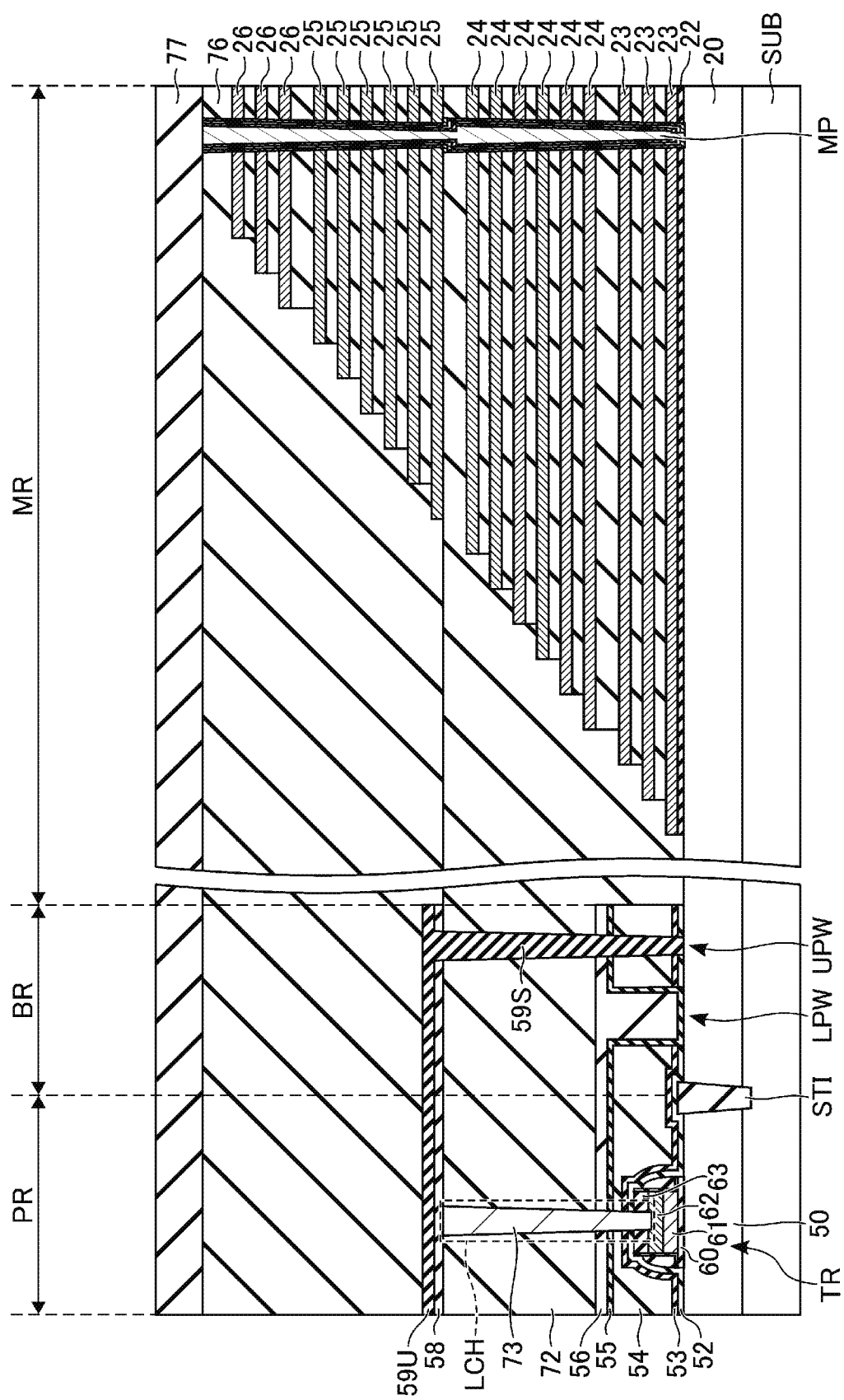

Accordingly, as shown in FIG. 26, the conductor layer 23 functioning as the select gate line SGS, the plurality of conductor layers 24 functioning as the word lines WL0 to WL5, and the plurality of conductor layers 25 functioning as the word lines WL6 to WL11, and the conductor layer 26 functioning as the select gate line SGD are formed. The conductor layers 23 to 26 formed in this step may contain a barrier metal. In this case, after removing the sacrificial members 70, 71, 74, and 75, for example, titanium nitride is formed as a barrier metal, and then tungsten is formed.

Figure 27:
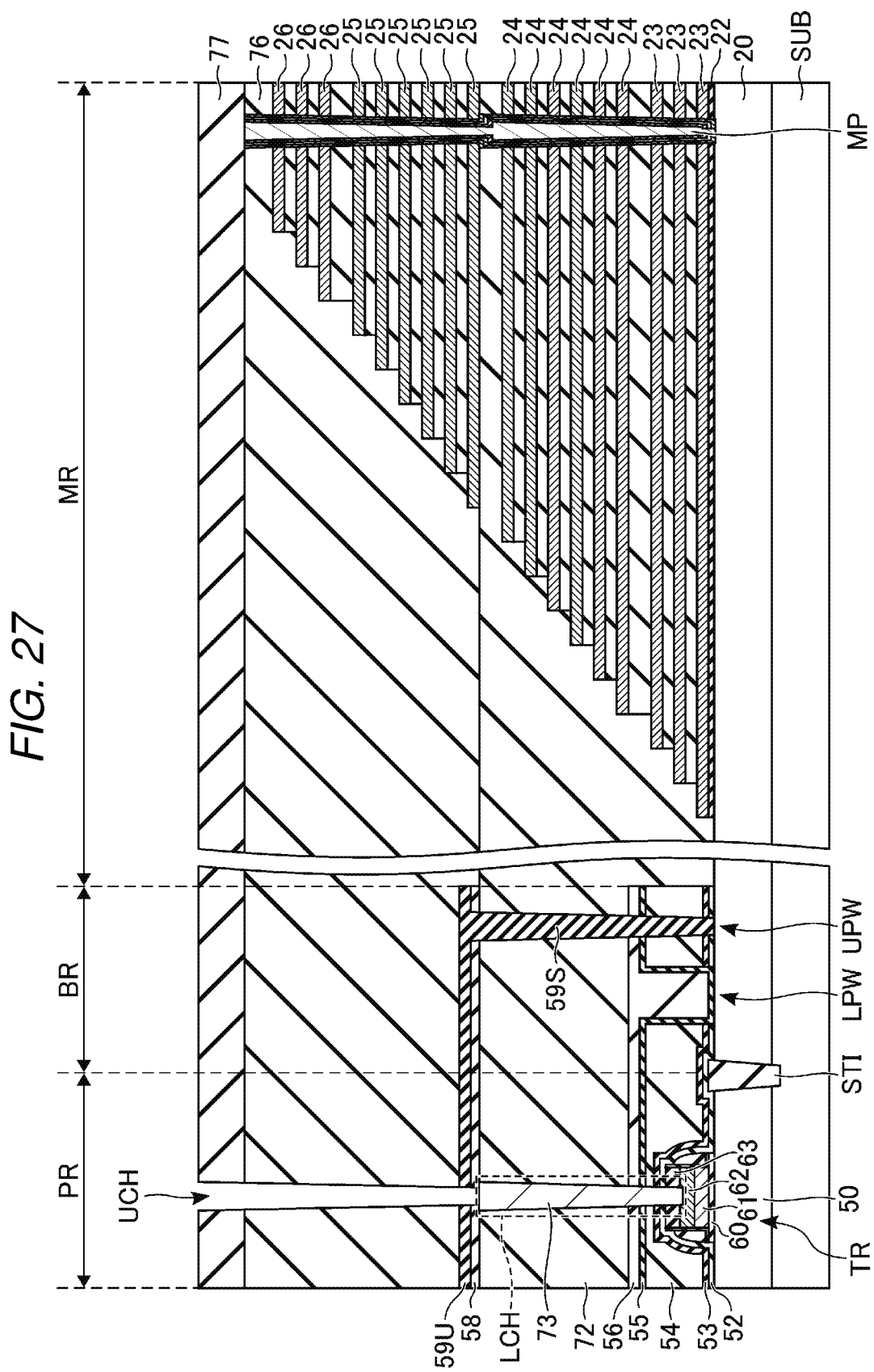

Next, the hole UCH is formed (step S112). Specifically, first, a mask having an opening region corresponding to the contact CG is formed by photolithography or the like. Then, the hole UCH corresponding to the contact CG as shown in FIG. 27 is formed by anisotropic etching using the mask. The hole UCH penetrates the insulating film 58, the insulators 59U and 76, and the insulator layer 77, and a part of the sacrificial member 73 in the hole LCH is exposed at the bottom of the hole UCH.

Figure 28:
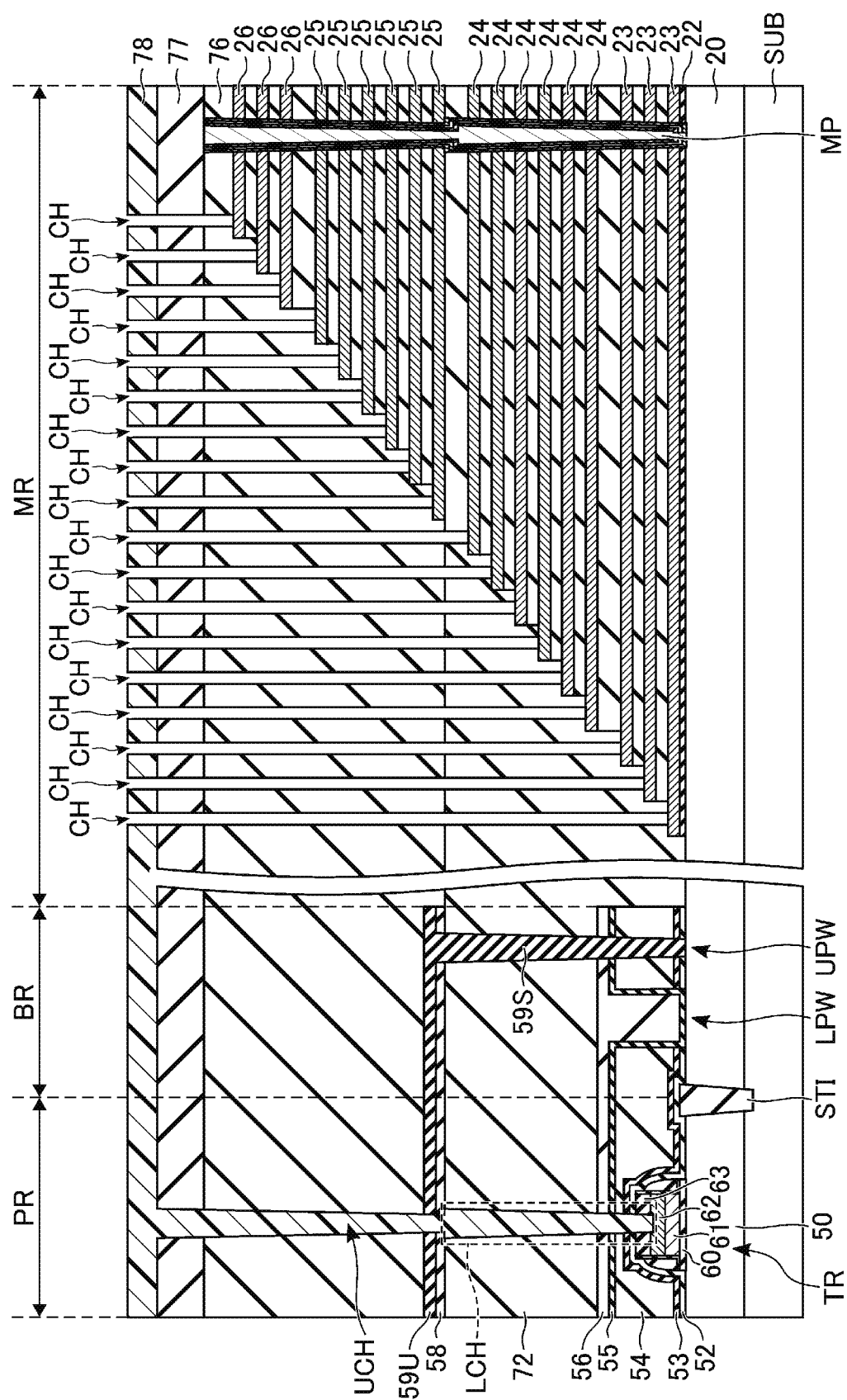

Next, a hole CH is formed (step S113). Specifically, first, the sacrificial member 73 in the hole LCH is removed through the hole UCH by wet etching. Then, a mask 78 is formed on the insulator layer 77 so that, for example, the holes LCH and UCH are buried. The mask 78 is, for example, a resist. Then, in the mask 78, a region corresponding to the contact CC is opened by photolithography or the like. Thereafter, the hole CH corresponding to the contact CC as shown in FIG. 28 is formed by anisotropic etching using the mask. The hole CH penetrates, for example, the insulators 72 and 76, the insulator layer 77, and the mask 78, and any one of the terrace portions of the conductor layers 23 to 26 whose ends are processed into a stepped shape is exposed at the bottom of the hole CH.

Figure 29:
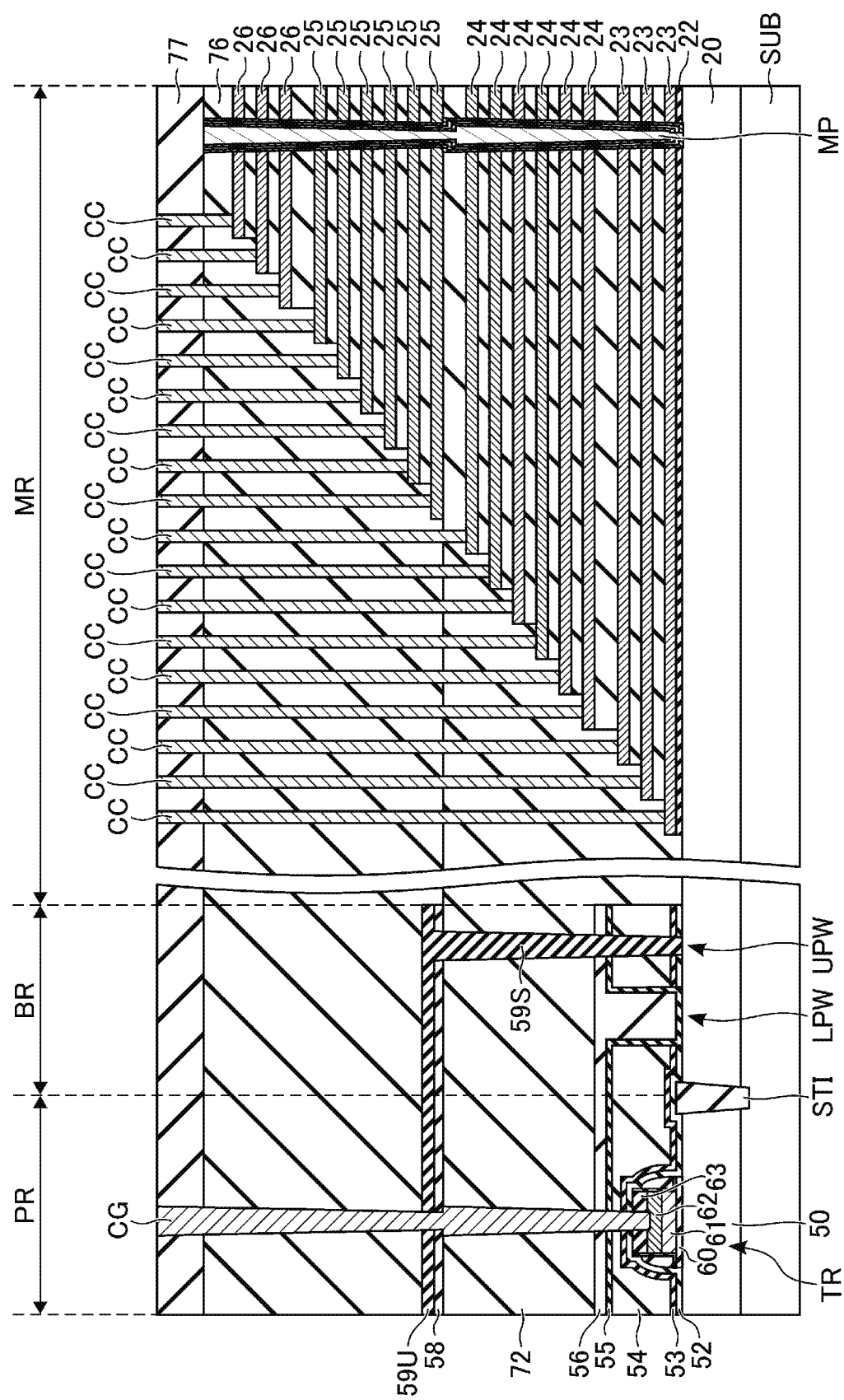

Next, contacts CC and CG are formed (step S114). Specifically, first, the mask 78 on the insulator layer 77 and the mask 78 in the holes UCH and LCH are selectively removed by wet processing. Thereafter, a conductor is formed on the insulator layer 77, and the holes UCH and LCH and the hole CH are filled with the conductor. Then, the conductors formed outside the holes UCH, LCH, and CH are removed. As a result, as shown in FIG. 29, the contact CG is formed in the connected holes LCH and UCH, and the contact CC is formed in the hole CH.

Through the manufacturing process of the semiconductor memory device 1 according to the embodiment described above, the transistor TR, the blocking portions LPW and UPW, the word lines WL, the select gate lines SGD and SGS, and the like are formed. The method for forming the contact CS whose description is omitted is substantially the same as the method for forming the contact CG except that a hole exposing a part of the N-type semiconductor region 51 is formed in step S104.

[1-3] Effects of Embodiment

According to the semiconductor memory device 1 according to the embodiment described above, the yield of the semiconductor memory device can be improved. Hereinafter, certain effects of the semiconductor memory device 1 according to the embodiment will be described by reference to a comparative example.

In a semiconductor memory device in which memory cells are three-dimensionally stacked, a peripheral circuit (hereinafter referred to as a CMOS portion) that controls the memory cell array is typically formed first, and then the stacked wiring of the memory cell array is formed. The stacked wiring may be a hydrogen generation source in the formation process thereof. Such hydrogen can be a factor in the performance degradation of the transistor in the CMOS portion, and can be a factor in yield reduction.

Figure 30:
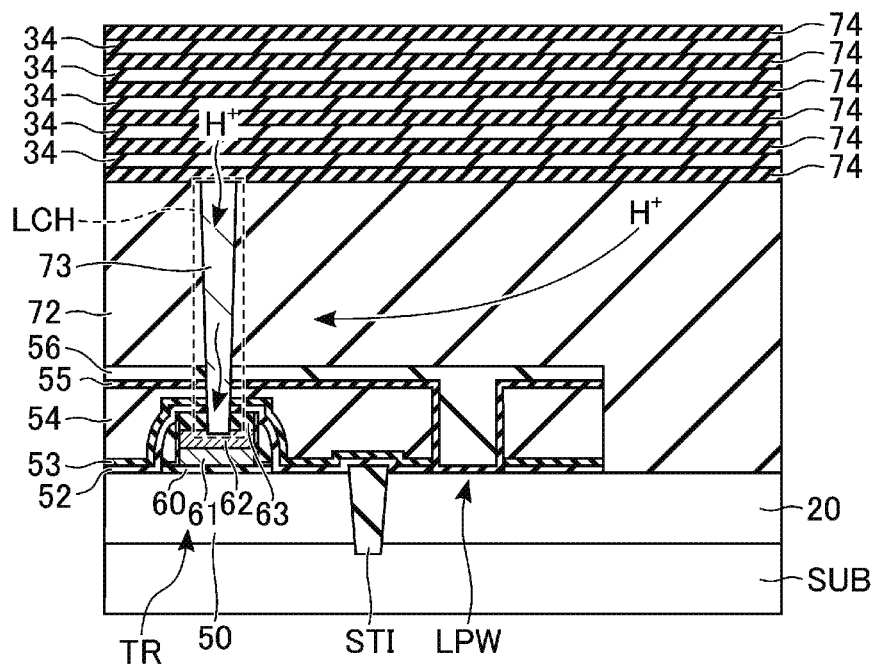
FIG. 30 illustrates a cross-sectional view of an example of a hydrogen penetration path in the manufacturing process of a semiconductor memory device according to a comparative example.

FIG. 30 shows an example of a cross section including the peripheral circuit region PR of the semiconductor memory device according to a comparative example. Further, FIG. 30 shows a state in which the sacrificial member 74 and the insulator layer 34 corresponding to the stacked wiring in the upper layer portion are stacked after the structure corresponding to the stacked wiring in the lower layer portion is formed. Hereinafter, the stacked structure such as the sacrificial member 74 and the like is referred to as a stacked wiring portion.

As shown in FIG. 30, the semiconductor memory device according to the comparative example has a structure in which the blocking portion UPW is omitted, unlike the embodiment. The insulating film 55 corresponding to the blocking portion LPW is, for example, a silicon nitride film, and can block the hydrogen generated in the stacked wiring portion. However, in the semiconductor memory device of the comparative example, the sacrificial member 73 that can permeate hydrogen penetrates the insulating film 55. That is, in this comparative example, there is a risk that hydrogen ($H^+$) generated in the stacked wiring portion enters the vicinity of the transistor TR through the sacrificial member 73, and the performance of the transistor TR is deteriorated.

Figure 31:
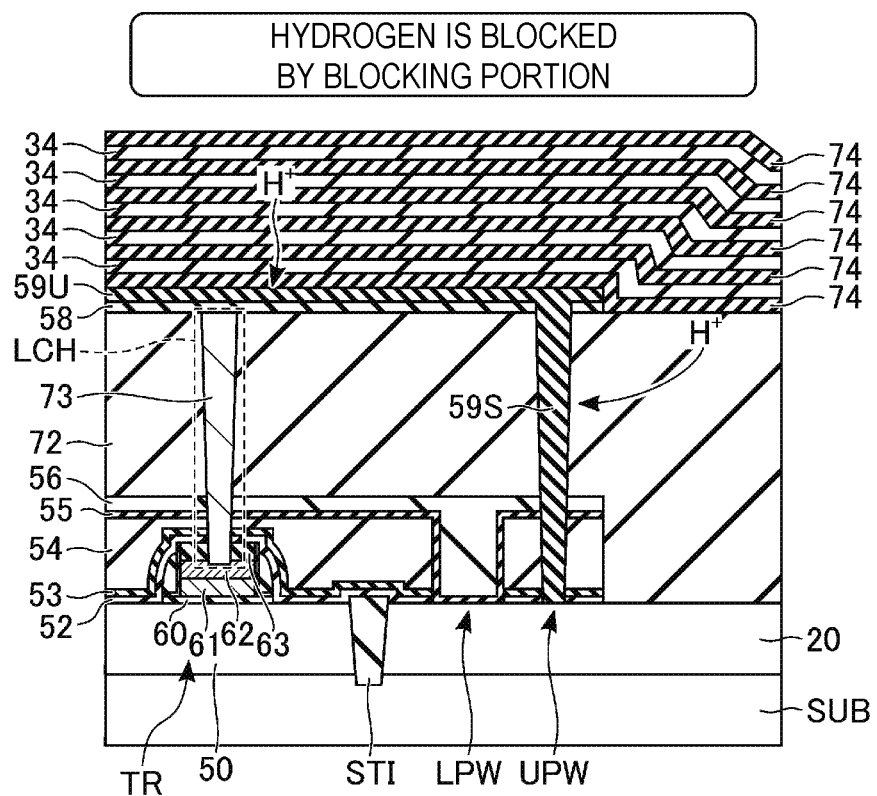
FIG. 31 illustrates a cross-sectional view of an example of a hydrogen penetration path in the manufacturing process of a semiconductor memory device according to an embodiment.

On the other hand, the semiconductor memory device 1 according to the embodiment has a structure in which the stacked wiring portion and the transistor TR are separated by the insulator 59 (blocking portion UPW). FIG. 31 is an example of a cross section including the peripheral circuit region PR of the semiconductor memory device 1 according to the first embodiment, and shows a region similar to FIG. 30.

As shown in FIG. 31, in the semiconductor memory device 1 according to the embodiment, the insulator 59S is provided to be in contact with the surface of the semiconductor substrate SUB and to separate the memory region MR and the peripheral circuit region PR. Then, the insulator 59U is provided to divide the region where the transistor TR is provided and the stacked wiring portion. That is, in the embodiment, the transistor TR in the CMOS portion is surrounded by the insulators 59U and 59S, and the insulators 54 and 72 provided around the transistor TR and the stacked wiring portion are spaced apart via the insulator 59.

In the semiconductor memory device 1 according to the embodiment, the insulator 59 can block the hydrogen generated during the formation of the stacked wiring portion. In other words, the hydrogen penetration path from the stacked wiring portion to the CMOS portion can be blocked by the insulator 59. As a result, the semiconductor memory device 1 according to the embodiment is more likely to suppress the performance degradation of the transistor TR due to hydrogen generated in the stacked wiring portion, and can improve the yield.

In addition, the semiconductor memory device 1 according to the embodiment further includes the blocking portion LPW. The blocking portion LPW includes the insulating film 55 capable of blocking hydrogen, similarly to the blocking portion UPW. The blocking portion LPW is provided to cover the transistor TR before a structure corresponding to the stacked wiring in the lower layer portion is formed. As a result, the blocking portion LPW can block the hydrogen generated when a structure corresponding to the stacked wiring in the lower layer portion is formed from entering the region of the transistor TR, and therefore is more likely to suppress the performance degradation of the transistor TR.

Furthermore, in the embodiment, the blocking portion UPW is provided outside the blocking portion LPW. Thus, the blocking portion UPW can prevent hydrogen from entering the transistor TR through the slit LST when the slit LST is formed. In order to obtain this effect, the blocking portion UPW may not divide the insulating film 55 between the insulator 72 and the insulator 54 in contact with the transistor TR at least when the slit LST is formed.

A structure such as a stacked wiring portion may also be formed in the end region ER. That is, the end region ER is also considered as a hydrogen generation source. On the other hand, in the semiconductor memory device 1 according to the embodiment, the peripheral circuit region PR and the end region ER are separated by the blocking portion UPW. As a result, the semiconductor memory device 1 according to the embodiment can also block the hydrogen generated in the end region ER by the insulator 59.

[2] Modification of Embodiment

The manufacturing process described in the embodiment is merely an example, and each manufacturing process may be divided, a manufacturing process may be replaced in the possible range, and another process may be inserted between each manufacturing process. Moreover, while the case where the holes LMH and LCH are collectively formed is illustrated, the holes LMH and LCH may be formed in separate steps. In the formation of the hole LCH, the bottom of the hole LCH may be stopped in the insulator layer 63. In this case, a part of the insulator layer 63 at the bottom of the hole LCH is removed before the contact CG is formed. The same applies to the contact CS, and the bottom of the hole formed simultaneously with the hole LCH and corresponding to the contact CS may be stopped at another layer.

Figure 32:
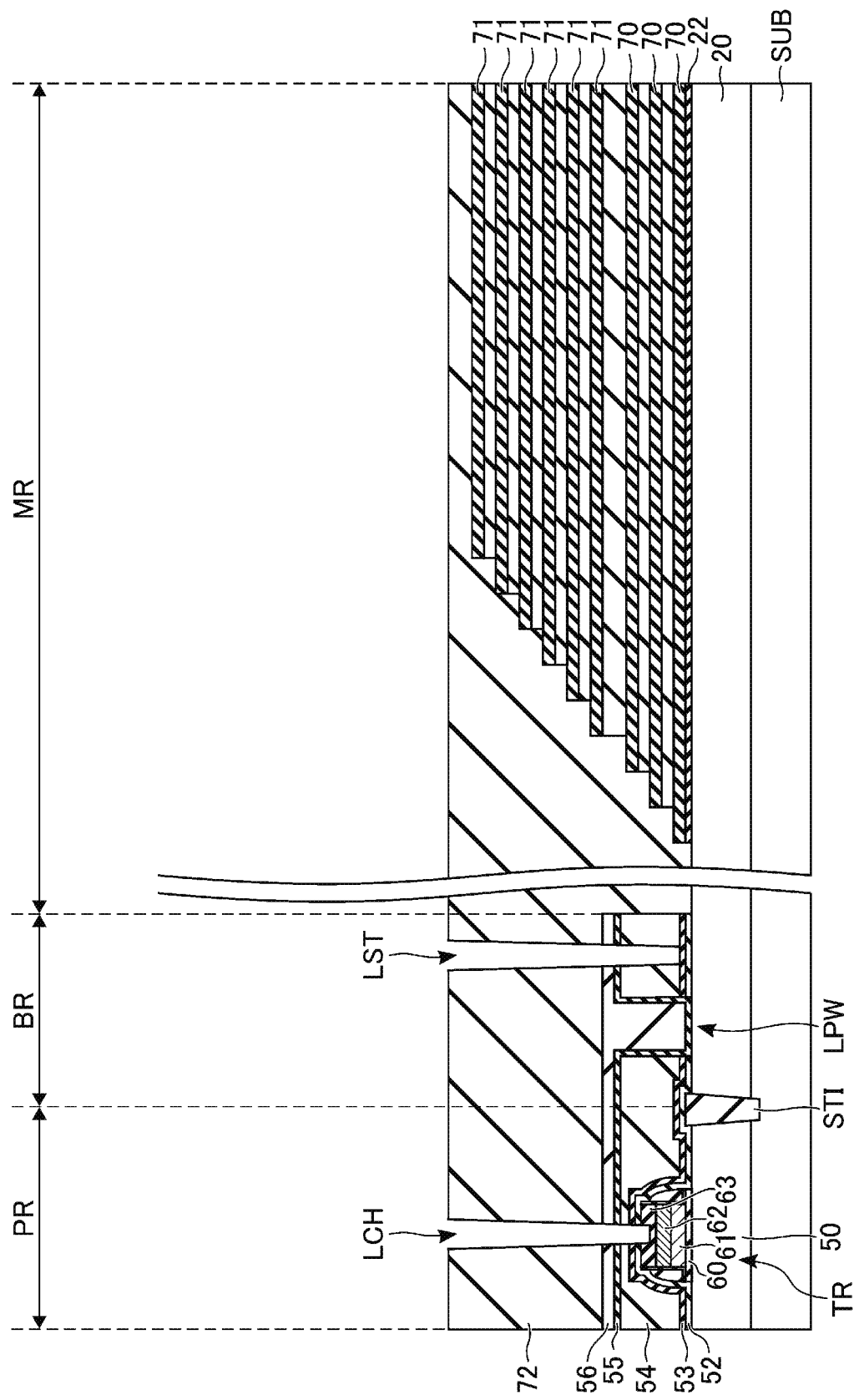
FIG. 32 illustrates a cross-sectional view of an example of a cross-sectional structure in the process of manufacturing a semiconductor memory device according to a first modification.

FIG. 32 shows an example of a cross-sectional structure in the process of manufacturing the semiconductor memory device 1 according to a first modification of the embodiment, and shows the case where the process of step S104 is divided into the formation of the hole LCH and the slit LST, and the formation of the hole LMH. As shown in FIG. 32, when the hole LCH and the slit LST are formed simultaneously, for example, the bottom of the hole LCH stops at the insulator layer 63, and the bottom of the slit LST stops at the insulating film 53. Thereafter, a mask having an opening in the hole LMH is formed, and the hole LMH is formed. Other manufacturing methods in the first modification are the same as those in the embodiment.

Figure 33:
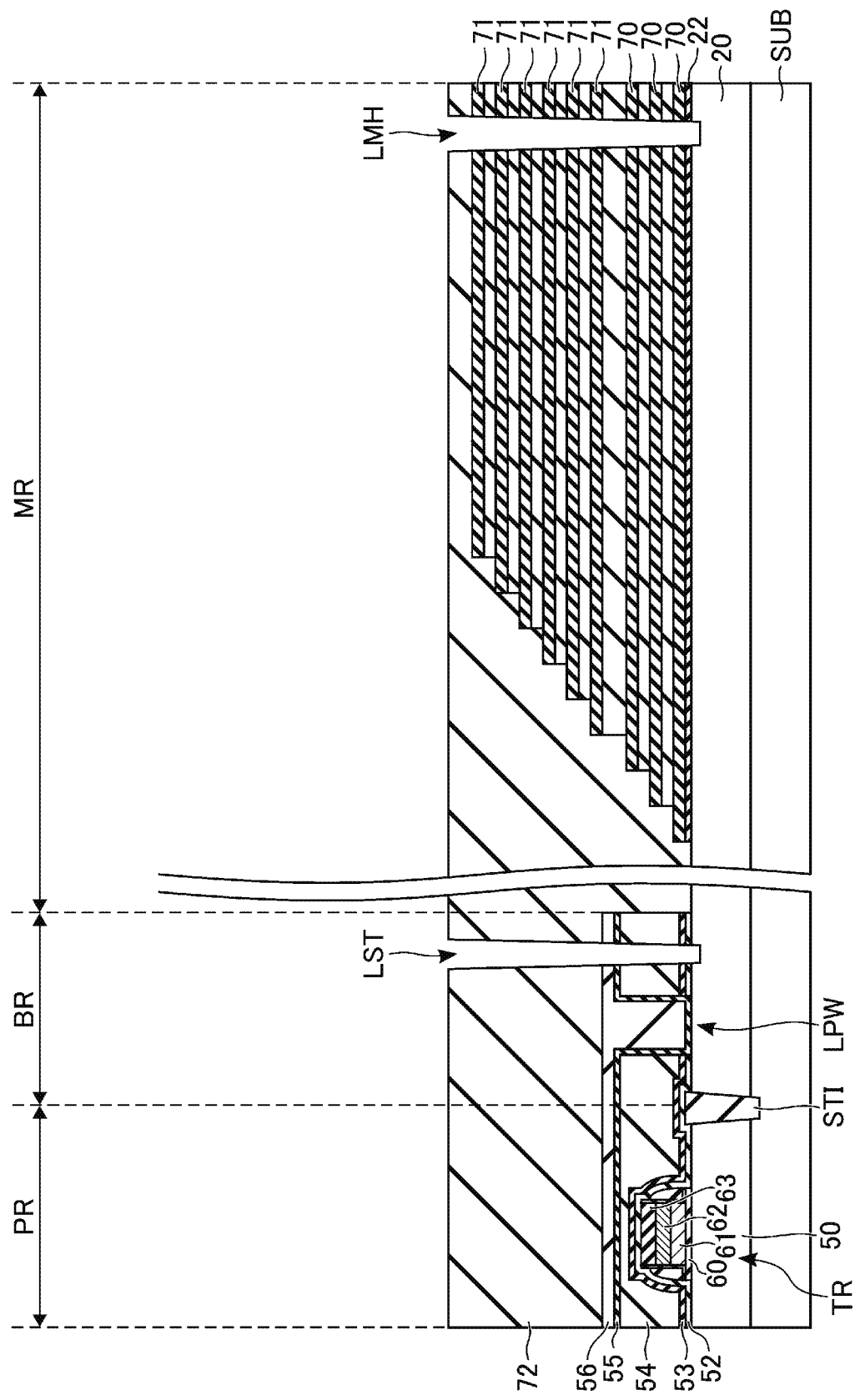
FIG. 33 illustrates a cross-sectional view of an example of a cross-sectional structure in the process of manufacturing a semiconductor memory device according to a second modification.

FIG. 33 shows an example of a cross-sectional structure in the process of manufacturing the semiconductor memory device 1 according to a second modification of the embodiment, and shows the case where the process of step S104 is divided into the formation of the hole LMH and the slit LST, and the formation of the hole LCH. As shown in FIG. 33, when the hole LMH and the slit LST are formed simultaneously, for example, the hole LMH penetrates the insulator layer 22 and the bottom of the hole LMH stops near the inside of the surface of the P-type well region 20. Similarly, the slit LST penetrates the insulating film 52, and the bottom of the slit LST stops near the inside of the surface of the P-type well region 20. Thereafter, a mask having an opening in the hole LCH is formed, and the hole LCH is formed. Other manufacturing methods in the second modification are the same as those in the embodiment.

Figure 34:
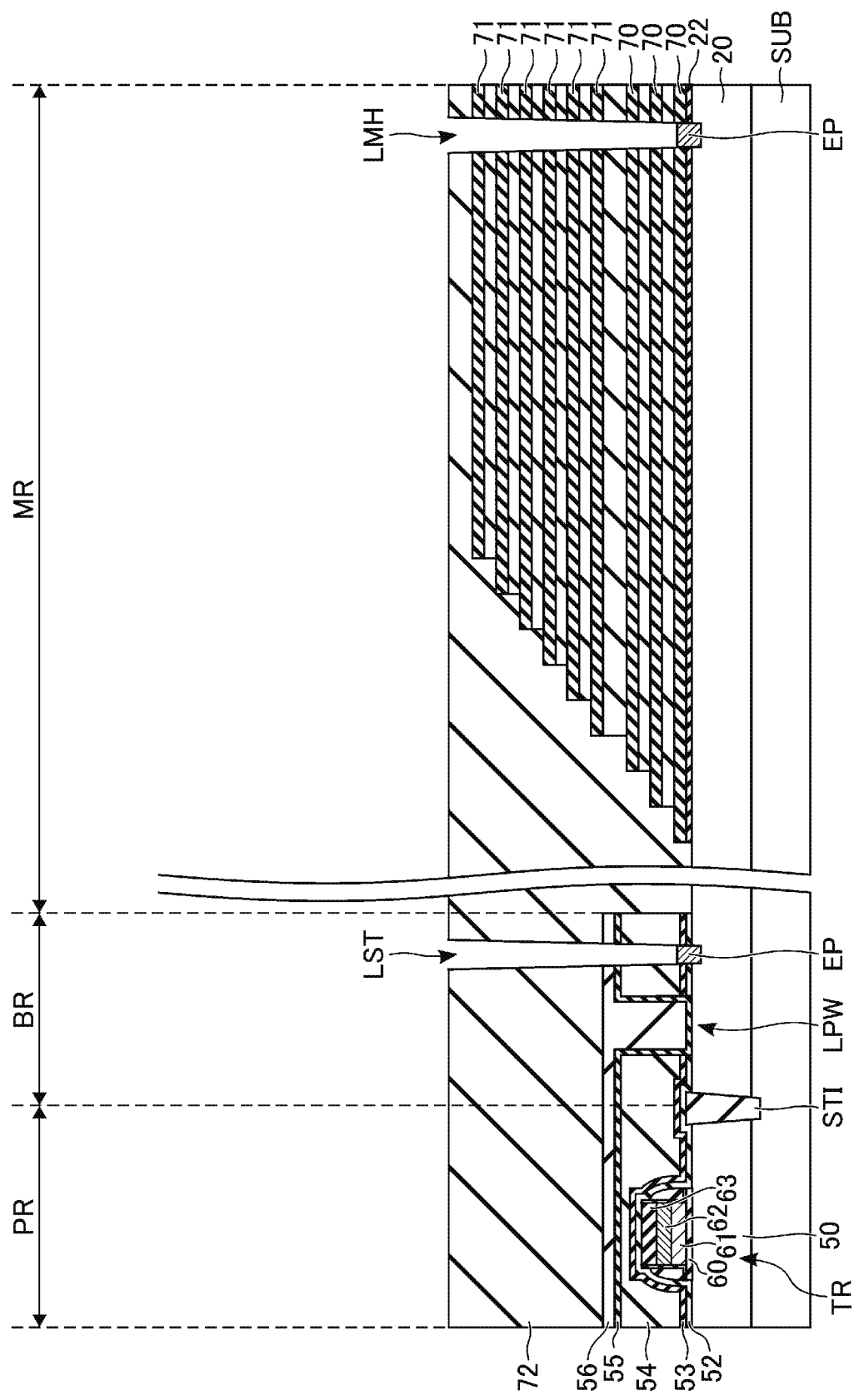
FIG. 34 illustrates a cross-sectional view of an example of a cross-sectional structure in the process of manufacturing a semiconductor memory device according to a third modification.

FIG. 34 shows an example of a cross-sectional structure in the process of manufacturing the semiconductor memory device 1 according to a third modification of the embodiment, and shows the case in which a process of forming a semiconductor layer at the bottoms of the hole LMH and the slit LST is added, unlike the second modification of the embodiment. After the hole LMH and the slit LST have been formed at the same time (as shown in FIG. 33), a semiconductor layer EP can be formed by epitaxial growth at the bottom of the hole LMH and the bottom of the slit LST, as shown in FIG. 34. Other manufacturing methods in the third modification are the same as those in the second modification. In the third modification, since the semiconductor layer 40 and the P-type well region 20 in the memory pillar MP are connected via the semiconductor layer EP, it is possible to suppress characteristic deterioration caused by silicon gouging.

[3] Other Modifications

In the embodiment, the case in which the insulating film 55 provided on the bottom of the blocking portion LPW is aligned with the surface of the P-type well region 20 is illustrated, while the blocking portion PW may enter the P-type well region 20. Furthermore, in the embodiment, the case in which the blocking portion LPW divides the region of the insulator 54 is illustrated, while the blocking portion LPW may divide the structure of a dummy transistor having the same structure as the transistor TR.

Figure 35:
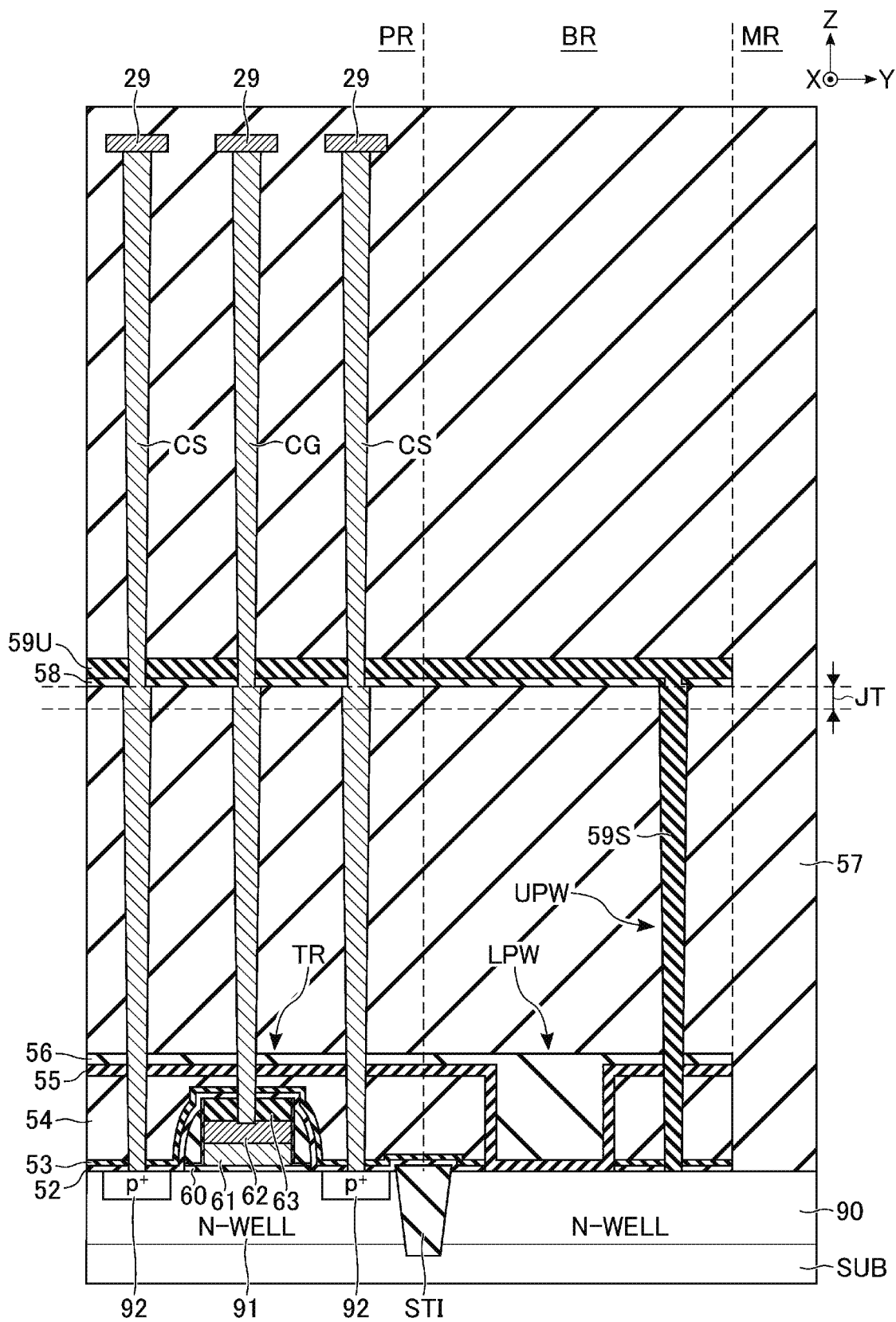
FIG. 35 illustrates a cross-sectional view of an example of the cross-sectional structure in the process of manufacturing a semiconductor memory device according to a fourth modification.

In the embodiment, the transistor TR is provided on the P-type well region 50, and the blocking portions LPW and UPW are arranged to overlap with the P-type well region 20, but the present disclosure is not limited thereto. For example, each of the transistor TR and the blocking portions LPW and UPW may be provided on the N-type well region. FIG. 35 shows an example of a cross-sectional structure in the peripheral circuit region PR of the semiconductor memory device 1 according to a fourth modification of the embodiment, and shows a region similar to FIG. 8 described in the embodiment.

As shown in FIG. 35, in the fourth modification of the embodiment, the P-type well regions 20 and 50 are replaced with N-type well regions 90 and 91, respectively, and the N-type semiconductor region 51 is replaced with a P-type semiconductor region 92. Each of the N-type well regions 90 and 91 is provided in the vicinity of the surface of the semiconductor substrate SUB. For example, the N-type well region 90 and the N-type well region 91 are spaced apart by the insulating region STI. On the N-type well region 90, the blocking portions LPW and UPW are provided. A P-type transistor TR is provided on the N-type well region 91. The P-type semiconductor region 92 is a P-type impurity diffusion region provided in the vicinity of the surface of the N-type well region 91 and corresponds to the source or drain of the P-type transistor TR provided in the peripheral circuit region PR. The P-type semiconductor region 92 is doped with boron, for example.

The semiconductor memory device 1 may have the structure of the first embodiment, the first to fourth modifications of the first embodiment, or may have a combination of these structures. That is, the semiconductor memory device 1 includes the blocking portions LPW and UPW that are at least in contact with the surface of the semiconductor substrate SUB (N-type well region, P-type well region, or the like). Thus, the semiconductor memory device 1 only needs to have a structure in which the upper side of the transistor TR is covered with the insulating film 55 having a portion provided along the blocking portion LPW and the insulator 59 having a portion provided along the blocking portion UPW.

In the above embodiments, the memory cell array 10 may have other structures than those already described. For example, the memory pillar MP may have a structure in which three or more pillars are connected in the Z-direction. The memory pillar MP may have a structure in which a pillar corresponding to the select gate line SGD and a pillar corresponding to the word line WL are connected.

In the drawings used for description in the example embodiments, a case in which the slits SLT have the same width in the Z-direction is illustrated, but the present disclosure is not limited thereto. For example, the slit SLT may have a tapered shape or an inversely tapered shape, or may have a shape in which the middle portion is enlarged with respect to the end portions. Similarly, the memory pillar MP and the contacts CS and CG may have a tapered shape or an inversely tapered shape in each of a portion located upper than the junction layer JT and a portion located lower than the junction layer JT, and may have a shape in which the middle portion is enlarged with respect to the end portions. In the example embodiments, a case in which the cross-sectional structures of the memory pillar MP and the contact CC, when viewed from above or the like, are circular is illustrated, but in other examples these cross-sectional structures may be elliptical or, in general, any other shape.

In this specification, "connection" indicates that they are electrically connected, and does not exclude, for example, that another element is interposed therebetween. In some instances, "electrically connected" may include a pathway be through an insulator as long as the elements "electrically connected" may still operate in the same manner as if electrically connected directly. "Columnar" refers to a structure provided in a hole formed in the manufacturing process of the semiconductor memory device 1. In this specification, "left and right side walls" indicate one side wall and the other side wall of the slit. The term "region" may be regarded as a configuration including the semiconductor substrate SUB or a portion thereof along with elements above the semiconductor substrate SUB. For example, when the semiconductor substrate SUB is stated to include the memory region MR, the peripheral circuit region PR, and the end region ER, the memory region MR, the peripheral circuit region PR, and the end region ER these should be understood to be associated regions above the semiconductor substrate SUB. In general, when a "distance" is stated to be between two different layers, this refers to the length measured along the vertical direction, with respect to the semiconductor substrate SUB, between the different layers, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a substrate including a first region on which memory cells are provided, a second region on which a control circuit of the memory cells is provided, and a third region separating the first region and the second region;
   a stack of first conductor layers spaced from each other above the first region of the substrate;
   a stack of second conductor layers spaced from each other above an uppermost one of the first conductor layers;
   a semiconductor pillar extending through the stack of first conductor layers and the stack of the second conductor layers;
   a third conductor layer above the second region of the substrate;
   a first insulator layer above the second and third regions of the substrate, the first insulator layer being not provided above the first region of the substrate, the first insulator layer including:
   a first portion that is above the third conductor layer at a height from the substrate greater than a height of the uppermost one of the first conductor layers and extends along a surface direction of the substrate, and
   a second portion that is continuous with the first portion, extends along a thickness direction of the substrate, and is in contact with a surface of the substrate in the third region;
   a second insulator layer provided above the third region between the uppermost one of the first conductor layers and the lowermost one of the second conductor layers;
   a third insulator layer between adjacent two of the first conductor layers; and
   a fourth insulator layer between adjacent two of the second conductor layers, wherein
   a thickness of the second insulator layer in the thickness direction is greater than a thickness of the third insulator layer and greater than a thickness of the fourth insulator layer.

2. The semiconductor memory device according to claim 1, wherein each of the first conductor layers is a select gate line, and each of the second conductor layers is a word line of one or more of the memory cells.

3. The semiconductor memory device according to claim 2, wherein the third conductor layer is a gate electrode of a transistor included in the control circuit.

4. The semiconductor memory device according to claim 1, further comprising:
   a stack of fourth conductor layers spaced from each other above an uppermost one of the second conductor layers, wherein
   an uppermost one of the fourth conductor layers is at a height from the substrate greater than a height of the first insulator layer.

5. The semiconductor memory device according to claim 4, further comprising:
   a sixth insulator layer provided between the uppermost one of the second conductor layers and the lowermost one of the fourth conductor layers.

6. The semiconductor memory device according to claim 1, wherein the height of the first portion of the first insulator layer is greater than a height of an uppermost one of the second conductor layers.

7. The semiconductor memory device according to claim 1, wherein the first insulator layer is a silicon nitride film.

8. The semiconductor memory device according to claim 1, further comprising:
   a contact that extends through the first insulator layer along the thickness direction of the substrate and is in contact with the third conductor layer.

9. The semiconductor memory device according to claim 1, wherein the second portion of the first insulator layer surrounds the second region of the substrate.

10. The semiconductor memory device according to claim 1, wherein
    the first conductor layers are spaced from each other at a first distance,
    the second conductor layers are spaced from each other at a second distance, and
    a distance between the uppermost one of the first conductor layers and a lowermost one of the second conductor layers is greater than the first distance and greater than the second distance.

11. The semiconductor memory device according to claim 1, further comprising:

a fifth insulator layer above the second and third regions of the substrate and below the first portion of the first insulator layer, wherein the fifth insulator layer includes:
- a third portion that extends along the surface direction of the substrate, and
- a fourth portion that is continuous with the third portion, extends along the thickness direction of the substrate, and is in contact with the surface of the substrate in the third region.

12. The semiconductor memory device according to claim 11, wherein the fourth portion of the fifth insulator layer surrounds the second region of the substrate, and the second portion of the first insulator layer surrounds the fourth portion of the fifth insulator layer.

13. The semiconductor memory device according to claim 11, wherein a thickness of the fifth insulator layer is uniform between the third portion and the fourth portion.

14. The semiconductor memory device according to claim 11, wherein each of the first insulator layer and the fifth insulator layer is a silicon nitride film.

15. The semiconductor memory device according to claim 11, wherein the third portion of the fifth insulator layer is at a height from the substrate greater than the height of the uppermost one of the first conductor layers.

* * * * *